United States Patent [19]
Hashimoto et al.

[11] Patent Number: 5,608,398
[45] Date of Patent: Mar. 4, 1997

[54] DIFFERENTIAL CODING METHOD AND AN APPARATUS THEREFOR

[75] Inventors: Kinji Hashimoto, Katano; Masakazu Nishino, Kashiwara; Tatsuro Juri, Osaka; Takumi Hasebe, Yawata, all of Japan

[73] Assignee: Matsushita Electric Industrial Co., Ltd., Osaka, Japan

[21] Appl. No.: 183,654

[22] Filed: Jan. 19, 1994

[30]  Foreign Application Priority Data

Jan. 20, 1993 [JP] Japan ..................... 5-007259

[51] Int. Cl.$^6$ ............... H01M 6/00; H04N 7/32
[52] U.S. Cl. .............. 341/76; 341/50; 348/416
[58] Field of Search ............... 341/50, 51, 67, 341/76; 348/416, 699

[56]  References Cited

U.S. PATENT DOCUMENTS

| | | | |
|---|---|---|---|
| 4,727,421 | 2/1988 | Koga . | |
| 4,797,653 | 1/1989 | Takayama | 341/51 |
| 4,875,095 | 10/1989 | Masumoto et al. | 358/133 |
| 5,361,104 | 11/1994 | Ohki | 348/699 |
| 5,428,396 | 6/1995 | Yagasaki et al. | 348/416 |
| 5,436,626 | 7/1995 | Fujiwara | 341/67 |

OTHER PUBLICATIONS

CCITT Recommendation H. 261, "Video Codec for Audio-visual Services at p x 64 kbit/s", pp. 1–27, (1990).

*Primary Examiner*—Jeffrey A. Gaffin
*Assistant Examiner*—Peguy JeanPierre
*Attorney, Agent, or Firm*—Ratner & Prestia

[57]  ABSTRACT

The differential coding apparatus comprises a delay unit for storing an adjacent value, a transmission value conversion unit for assigning a transmission value to a value of difference between the value to be coded and the adjacent value in the ascending order of the absolute value of the difference value, and a variable-length coding device for assigning a code in the order that the code is increasing in code length as the transmission value increases in number. In the range in which positive and negative difference values exist, positive and negative numbers are alternately given to difference values in the order in which the difference value is increasing in distance from a center difference value of 0. In the range in which either positive or negative difference value exists, serial numbers are successively given to difference values in the order in which the difference value is increasing in distance from the difference value of 0. Then codes are assigned in the order of their increasing in code length to the difference values in the order of the given numbers of transmission values.

18 Claims, 9 Drawing Sheets

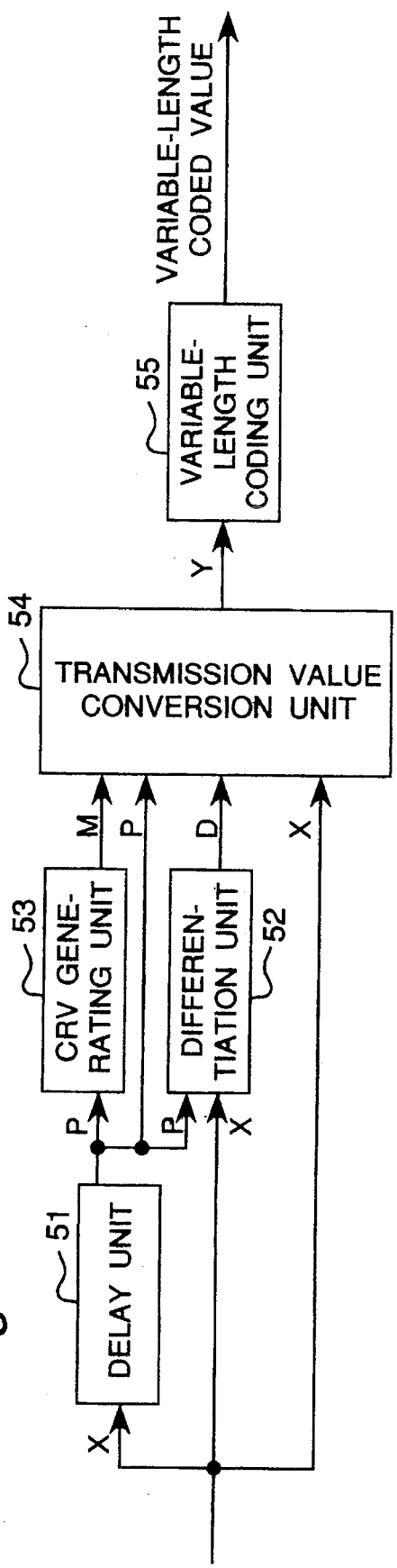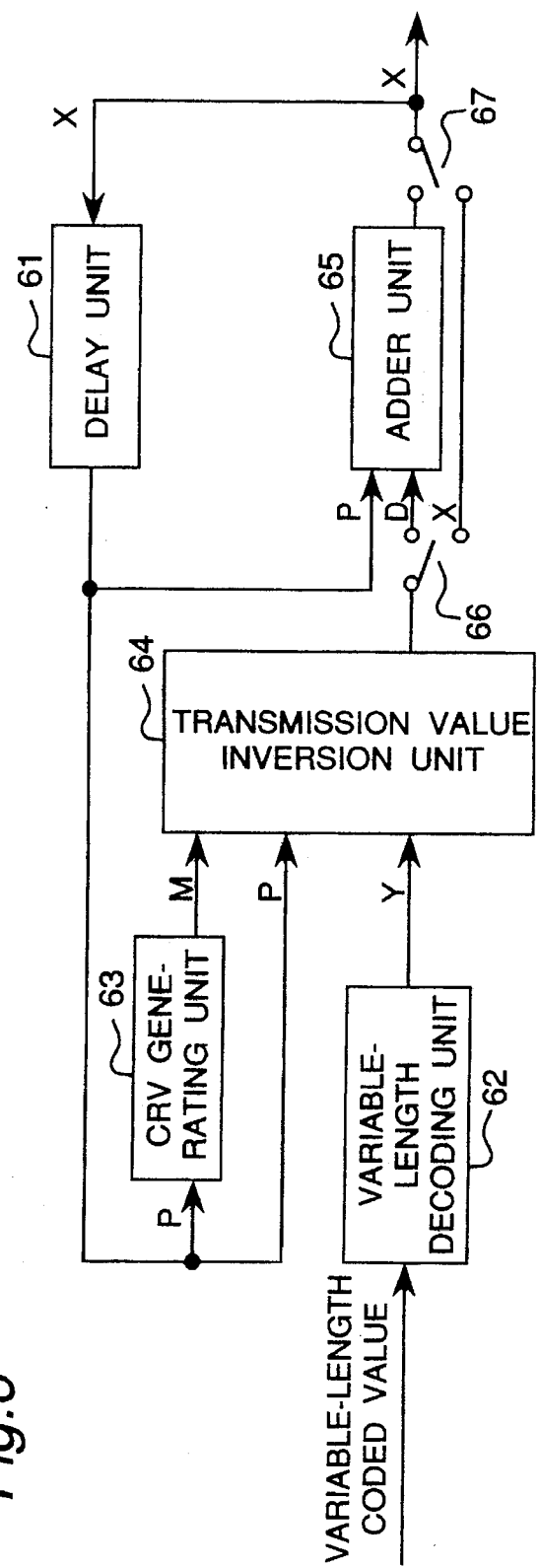
Fig.5
Fig.6

DIFFERENTIAL CODING METHOD AND AN APPARATUS THEREFOR

BACKGROUND OF THE INVENTION

1. Field of the Invention

The present invention relates to a method and apparatus for differential coding for use in reducing an amount of data of a time series signal such as a video signal when recording and transmitting the signal.

2. Description of the Prior Art

Among coding apparatuses for coding a time series signal such as a video signal, there is an apparatus for reducing a redundancy on a time base. A representative example is Moving Picture Coding Experts Group (referred to as "MPEG" hereinafter) which is currently under energetic discussion for standardization. In MPEG, DCT (Discrete Cosine Transform) is utilized for compression of data in spatial directions, while inter-frame prediction and motion compensation are utilized for compression of data on the time base.

In the motion compensation, input image data is divided into a plurality of blocks each composed of 16×16 pixels and the reproduced image of the previous frame is shifted by a motion vector to achieve an inter-frame prediction. The motion vector is expressed by vector components in the horizontal and vertical directions and each component is individually coded. The range of existence of the motion vector value depends on the range of the motion compensation.

As a method of coding a motion vector, there is employed a variable-length coding technique in MPEG for converting a difference value between an object value to be currently coded and its adjacent motion vector value into a variable-length code. The variable-length coding method is adopted because it is considered that a difference value between an object value to be coded and its adjacent value is zero when in panning or in an area except for edges of a moving object. It is also considered that the difference value is small in zooming operation. By converting the difference value into a variable-length code, the amount of codes is reduced. In this method, by taking a difference value between an object value to be coded and its adjacent value, the range of existence of the difference value is expanded to a range two times as great as that of the motion vector value. However, the amount of code words can be reduced to about half by adopting an aliasing (or folding) coding method. The aliasing coding method is disclosed in CCITT Recommendation H. 261 'VIDEO CODEC FOR AUDIOVISUAL SERVICES AT p×64 Kbit/s (1990)'.

The following describes methods of composing code words according to the conventional differential coding method and aliasing coding method with reference to FIGS. 1 to 14 using Tables 7 to 9.

FIG. 11 shows a method of composing code words according to the conventional differential coding method. In FIG. 11, X represents an object value to be currently coded, P represents an adjacent value, D represents a value of difference between the value X to be coded and the adjacent value P (i.e., $D=X-P$), and Y represents a transmission value. The value to be coded ranges from −16 to +15.

First, when the adjacent value P is e.g. +5, the difference value D ranges from −21 to +10. Since the difference value D is directly used as a transmission value Y in the conventional differential coding method, the transmission value Y ranges from −21 to +10. In FIG. 11, a folded (or polygonal) line composed of solid lines (L1, L2) and dotted lines (L3, L4) represents the code length with respect to the base line Y. When the adjacent value is +5, the solid line portion (L1, L2) of the folded line represents the code length of the transmission value to be taken in the range of −21 to +10. In this case, a code having the shortest code length is assigned to the transmission value of 0, and a code having the second shortest code length is subsequently assigned to the next transmission value adjacent to the value of 0. Similarly, other codes are assigned in turn to the other transmission values in the order that the code length increases as the transmission value increases in distance from the transmission value of 0.

However, since the adjacent value P ranges from −16 to +15, the difference value D (=X−P) ranges from −31 to +31, and therefore the transmission value Y also ranges from −31 to +31. Consequently, in this case, 63 pieces of code words are necessary in number for the transmission values.

FIG. 12 shows another method of composing code words according to the conventional aliasing coding technique. In FIG. 12, similarly to FIG. 11, X represents a value to be coded, P represents an adjacent value, D represents a difference value between the value X to be coded and the adjacent value P, and Y represents a transmission value. The value to be coded ranges from −16 to +15.

First, when the adjacent value is, for example, 5, the difference value D ranges from −21 to +10. According to the aliasing coding method, the difference value D is not directly used as a transmission value Y. When the difference value D is equal to or greater than +16, a value obtained by subtracting a number of 32 from the difference value D is used as the transmission value Y. Otherwise, when the difference value D is smaller than −16, a value obtained by adding a number of 32 to the difference value D is used as the transmission value Y. Consequently, the transmission value Y ranges from −16 to +15. In this example of FIG. 12, when the difference value D is in the range of −17 to −21, a number of 32 is added to the difference value D to make the transmission value Y range from +15 to +11 in composing each code word.

In FIG. 12, the folded solid line shows the code length of the code words for the transmission value Y to be taken when the adjacent value P is +5. In this case, a code having the shortest code length is assigned to the transmission value of 0, and other codes are assigned in turn to the other transmission values in the order that the code length increases as the transmission value increases in distance from the transmission value of 0. With the above-mentioned arrangement of FIG. 12, the code words assigned as the transmission value to be taken is 32 in number, which is reduced to about half of that achieved according to the conventional differential coding method of FIG. 11.

The following describes a conventional differential coding apparatus based on the differential coding method adopted in MPEG utilizing the aliasing coding technique with reference to FIG. 13.

FIG. 13 shows a block diagram of a conventional differential coding apparatus, where reference numeral 131 denotes a delay unit, 132 a differentiation unit, 133 a transmission value conversion unit, and 134 a variable-length coding unit.

First, an adjacent value P is stored in the delay unit 131 with receipt of an object value X to be currently coded. In the above process, when no adjacent value exists in such a case of the first value or the like, the adjacent value P is set 0. Then, in the differentiation unit 132, a difference value D between the value X to be coded and the adjacent value P stored in the delay unit 131 is calculated according to the following equation:

$$D = X - P$$

Further, in the transmission value conversion unit 133, a transmission value Y is obtained according to the following equations:

$Y = D - 32$ (when $D \geq +16$), $Y = D + 32$ (when $D < -16$), and $Y = D$ in any other cases (i.e., when $-16 \leq D < +16$).

Finally, in the variable-length coding unit 134, each transmission value Y is converted into a variable-length code by assigning a code word having the shorter code length to the transmission value having the smaller absolute value in accordance with a variable-length coding table as shown in Table 7. Table 7 is obtained by adding as shown in Table 7. Table 7 is obtained by adding a code having a value of −16 to the variable-length coding table employed in MPEG. Therefore, the value to be coded ranges from −16 to +15, while the difference value D ranges from −31 to +31. Meanwhile, the transmission value Y ranges from −16 to +15.

FIG. 14 shows a block diagram of a decoding apparatus for decoding a value coded by the conventional differential coding apparatus shown in FIG. 13. In FIG. 14, reference numeral 141 denotes a delay unit, 142 a variable-length decoding unit, 143 an adder unit, and 144 a transmission value inversion unit.

First, an adjacent value P is stored in the delay unit 141 with receipt of a value X to be processed. In the above process, when no adjacent value exists in such a case of the first value or the like, the adjacent value is set 0. Then in the variable-length decoding unit 142, a transmission value Y is obtained by decoding a variable-length coded data in accordance with the variable-length coding table shown in Table 7. Further in the adder unit 143, the sum value A of the transmission value Y and the adjacent value P stored in the delay means 141 is obtained according to the following equation:

$$A = Y + P$$

Finally, in the transmission value inversion unit 144, the value A is decoded to obtain a decoded value X according to the following equations:

$X = A - 32$ (when $A \geq +16$), $X = A + 32$ (when $A < -16$), and $X = A$ in any other cases (i.e., $-16 \leq A < +16$)

Table 8 shows the case where P=+5, while Table 9 shows the case where P=−12.

In Table 8, in the coding operation, since the difference value D is smaller than −16 (i.e., ranges from −21 to −17) when the value X to be coded ranges from −16 to −12, the transmission value Y is obtained by adding a number of 32 to the difference value D. Conversely in the decoding operation, since the sum value A is equal to or greater than +16 when the transmission value Y ranges from +11 to +15, a decoded value X output from the unit 144 is obtained by subtracting a number of 32 from the sum value A.

In Table 9 where P=−12, in the coding operation, since the difference value D is equal to or greater than +16 when the value X to be coded ranges from +4 to +15, the transmission value Y is obtained by subtracting a number of 32 from the difference value D. Conversely in the decoding operation, since the sum value A is smaller than −16 (i.e., ranges from −28 to −17) when the transmission value Y ranges from −16 to −5, a decoded value X is obtained by adding a number of 32 to the sum value A.

By utilizing the aliasing coding method, the range of existence of the transmission value Y can be reduced to half of that of the difference value D, which allows to dimensionally reduce the coding table for converting each difference value into a variable-length code.

However, in the conventional method and apparatus for differential coding utilizing the aliasing coding method described as above, the absolute value of the transmission value decreases according as the absolute value of the difference value increases in the range where the difference value exceeds the range in which the transmission value can exist, i.e., in the range where the aliasing is taking effect. Therefore, the above-mentioned arrangement has been accompanied by a problem that the coding efficiency reduces in using a variable-length coding table in which the code length is made shorter according as the transmission value reduces in absolute value.

SUMMARY OF THE INVENTION

Accordingly, in view of the aforementioned problems of the conventional method and apparatus for differential coding, the present invention has an essential objective to provide a method and apparatus for differential coding capable of assigning codes in the order in which the code is increasing in code length to difference values in the ascending order of the absolute values of the difference values within a predetermined range in number of code words.

In order to achieve the above-mentioned objective, the present invention provides a differential coding method which comprises the steps of: giving different numbers individually to difference values each obtained by calculating a difference between each value to be coded and a value adjacent thereto, wherein said different numbers are successively assigned to said difference values in the order of ascending the absolute values of said difference values; and assigning a code word to each difference value in the order that the code word is increasing in code length in accordance with the increase of the different numbers given to said difference values.

In the method of the present invention, assuming that the difference value D between the value X to be coded and the adjacent value P is calculated according to the equation $D = X - P$ and that the value X to be coded exists in the range from $A \leq X \leq B$, and a conversion reference value M is defined by the equations as following:

$M = B - P$ when $P \leq 0$, and $M = P - A$ when $P < 0$ where A and B are integers and A<B, each difference value D is converted into a transmission value Y with reference to the conversion reference value M according to the equations as following:

in the case where $P \geq 0$,
$Y = 2D$ when $D \geq 0$, $Y = -2D - 1$ when $-M \leq D < 0$, and $Y = -D + M$ in any other case, and -continued in the other case where $P < 0$
$Y = -2D - 1$ when $D < 0$,
$Y = 2D$ when $0 \leq D \leq M$, and
$Y = D + M$ in any other case.

Further, the present invention provides a differential coding apparatus which comprises: delay means for storing an adjacent value; transmission value conversion means for assigning a transmission value to a value of difference between the value to be coded and the adjacent value stored in the delay means in the ascending order of the absolute value of the difference value; and variable-length coding means for assigning a code having the shorter code length to each difference value in the order in which the transmission value is assigned.

With the above-mentioned arrangement, the differential coding apparatus of the present invention stores an adjacent value, and forms a difference value between the value to be coded and the adjacent value. In the range in which positive and negative difference values exist, positive and negative numbers are alternately given to difference values which can exist in between a value and its adjacent value in the order in which the difference value is increasing in distance from a center difference value of 0. In the range in which either positive or a negative difference value exists, varied numbers are successively given to difference values in the order in which the difference value is increasing in distance from the difference value of 0. Then codes are assigned in the order of their increasing in code length to the difference values in the order in which the numbers are given to the transmission values.

The present invention can provide a method and apparatus for differential coding having the following effects:

(1) In coding a difference value, a table for variable-length coding of the difference value can be dimensionally reduced to have code words reduced about half in number of those in the range in which the difference value can exist to allow simplification of processing and compacting of hardware.

(2) Codes are assigned in the order of their increasing in code length to difference values in the ascending order of the absolute values of the difference values to allow highly efficient coding of each value.

BRIEF DESCRIPTION OF THE DRAWINGS

These and other objects and features of the present invention will become apparent from the following description taken in conjunction with the preferred embodiment thereof with reference to the accompanying drawings, in which:

FIG. 5 is a block diagram of a differential coding apparatus in accordance with a second embodiment of the present invention;

FIG. 6 is a block diagram of a differential decoding apparatus of the second embodiment;

DETAILED DESCRIPTION OF THE PREFERRED EMBODIMENTS

First Embodiment

Figure 1:
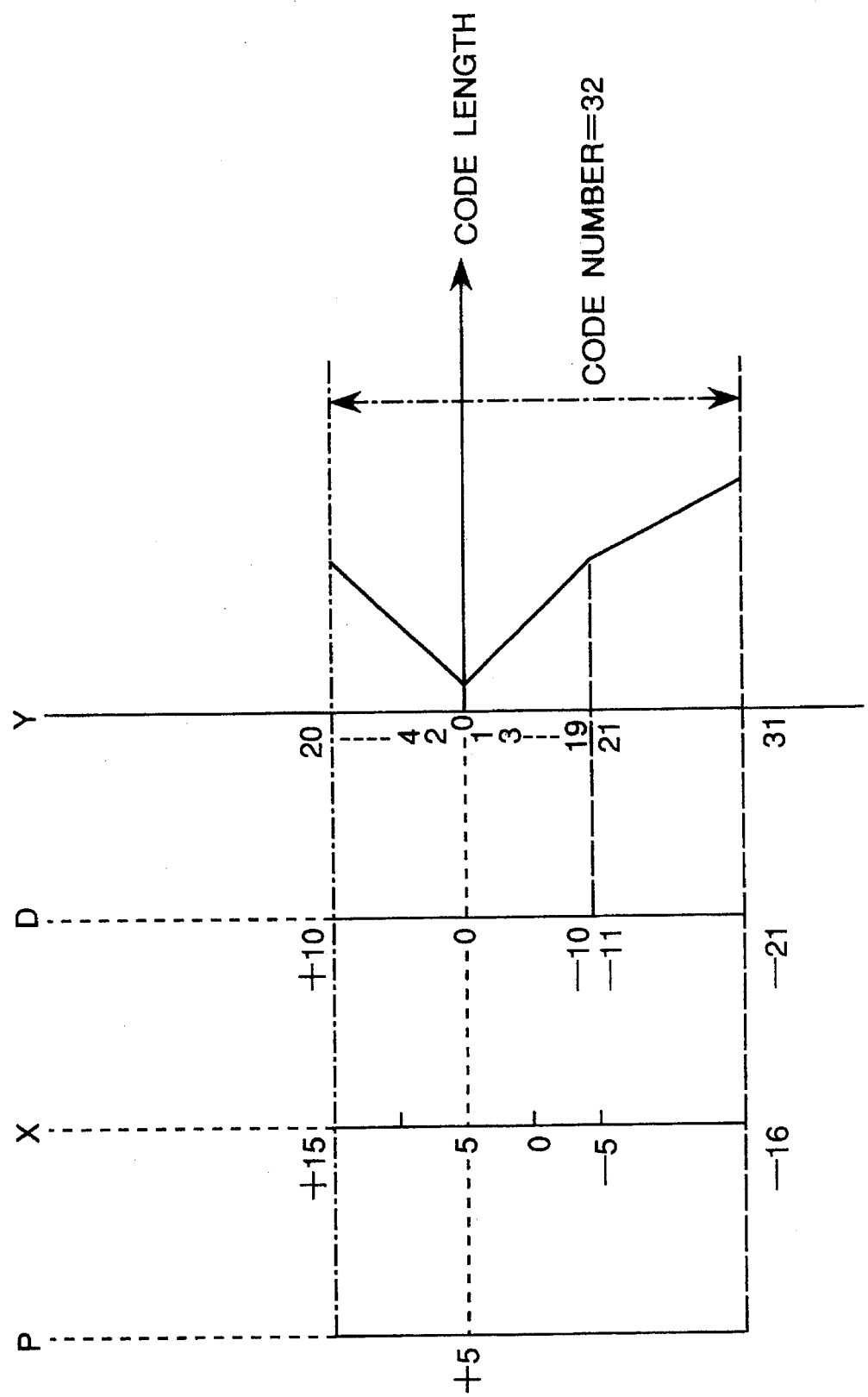
FIG. 1 is an explanatory view of a method for composing code words when P=5 in accordance with a coding method of the present invention.
Figure 2:
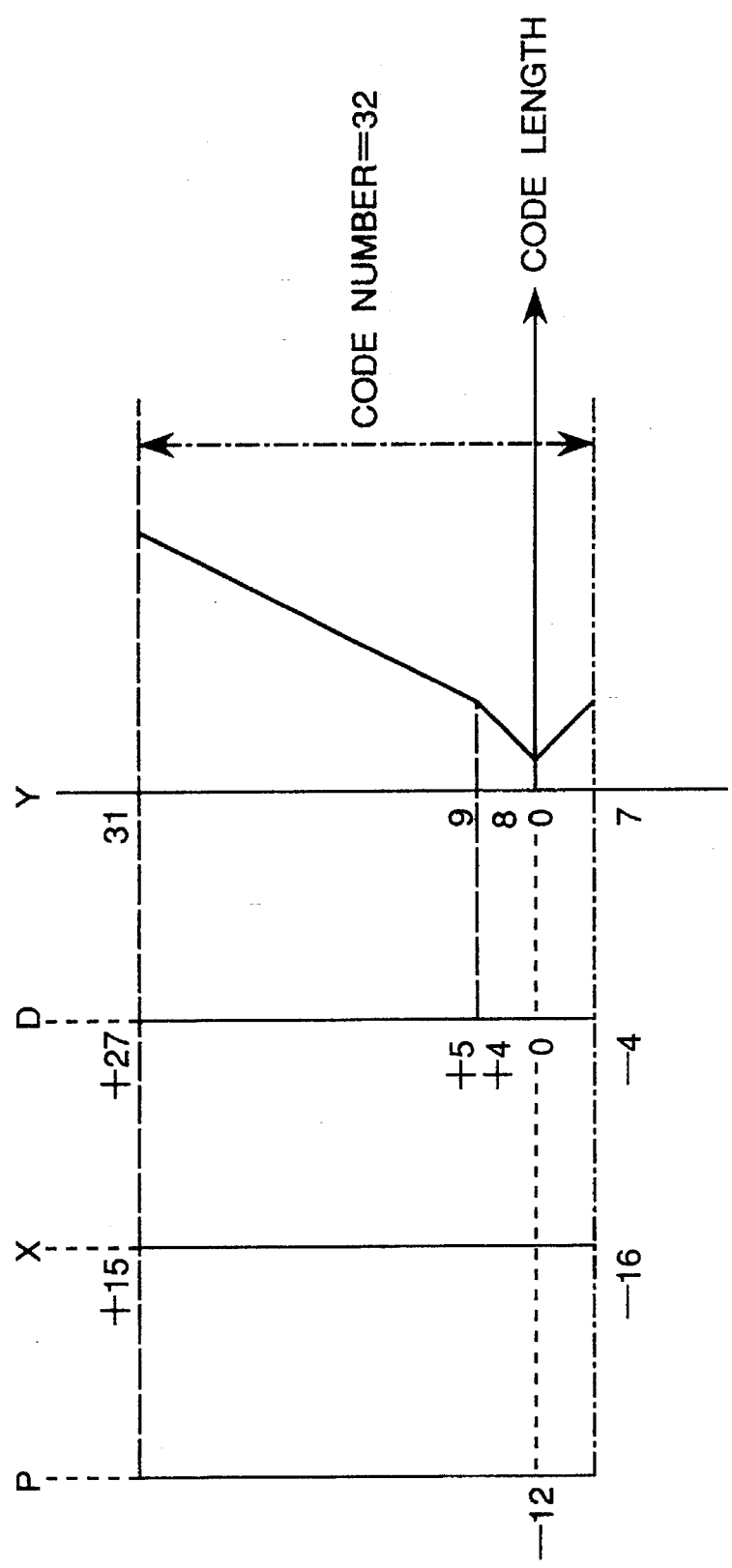
FIG. 2 is an explanatory view of a method for composing code words when P=−12 in accordance with a coding method of the present invention.

The following describes a first embodiment of a code word constitution according to the present invention with reference to FIGS. 1 and 2.

FIG. 1 shows a case where an adjacent value is a non-negative number (for example, +5). In FIG. 1, X represents an object value to be currently coded, P represents an adjacent value, D represents a difference value between the object value X to be coded and the adjacent value P, and Y represents a transmission value. It is assumed here that the value to be coded ranges from −16 to +15.

First, when the adjacent value P is +5, the difference value D (=X−P) ranges from −21 to +10. In the range of the difference value D from −10 to +10, the first number 0 of the transmission value Y is assigned to a center difference value 0, and subsequent number 1 of the transmission value Y is assigned to the next difference value −1, and then the subsequent number 2 is assigned to the next difference value +1, and similarly the rest serial numbers 3 to 20 of the transmission value Y are alternately assigned to the negative and positive difference values D (successively from the negative one to the positive one in the present case) in accordance with the distance from the center difference value 0 in the order that the difference value increases in distance from the difference value 0. Thus, in the present case, the transmission values Y of 0 to 20 are assigned to the difference values D which are in the range of −10+10.

It is now assumed that the maximum absolute value 10 of the difference value D in the range having a pair of positive and negative values is selected as a conversion reference value. It is impossible to assign the transmission values of code words alternately to positive and negative difference values when the difference value D exceeds the range of the conversion reference value 10. In more detail, when the difference value ranges from −11 to −21 in FIG. 1, serial numbers from 21 to 31 are assigned to the difference values from −11 to −21 respectively in the order that the difference value is increasing in distance from the difference value of 0.

According to the differential coding method of the present embodiment, codes are assigned to the difference values in the order that, the smaller the distance from the center transmission value 0, the shorter the code length of the code word. In other words, the code words have their code length being longer as the transmission value increases in number. The folded solid line represents the code length of the code words with respect to the base line Y when the code words are assigned as the transmission values Y to be taken. In this case, the number of the code words is 32.

FIG. 2 shows a case where the adjacent value P is a negative value (for example, −12). In FIG. 2, similarly to FIG. 1, X represents a value to be coded, P represents an adjacent value, D represents a difference value between the value X to be coded and the adjacent value P, and Y represents a transmission value. The value to be coded ranges from −16 to +15.

First, when the adjacent value P is −12, the difference value D ranges from −4 to +27. When the difference value D is in the range from −4 to +4, the first number 0 of the transmission value Y is assigned to a center difference value 0, and then serial numbers of 1 to 8 are alternately assigned to the negative and positive difference values D in accordance with the distance from the center difference value 0 (successively from the negative one to the positive one in the present case) in the order that the difference value increases in distance from the center difference value 0. In the present case, the transmission values Y from 0 to 8 are assigned to the difference values D when in the range from −4 to +4. It is now assumed that the maximum absolute value 4 of the difference value capable of having a pair of positive and negative values is selected as a conversion reference value.

It is impossible to assign code words alternately to positive and negative difference values when the difference value D exceeds the range of the conversion reference value 4. In more detail, when the difference value D ranges from +5 to +27 in this case, serial numbers from 9 to 31 of the transmission values Y are assigned to the difference values from +5 to +27 respectively in the order that the difference value is increasing in distance from the difference value of 0.

In a manner described as above, codes are assigned to the difference values in the order that, the smaller the distance from the center transmission value 0, the shorter the code length of the code word. In other words, the code words have their code length being longer as the transmission value increases in number. The folded solid line represents the code length of the code words with respect to the base line Y when the code words are assigned as the transmission values Y to be taken. In this case, the number of the code words is 32.

Through the coding operation having the above-mentioned code construction, code words can be assigned to the difference values D in the order that the code length of the code words increases in accordance with the ascending order of the absolute values of the difference values within a predetermined number of code words.

Figure 3:
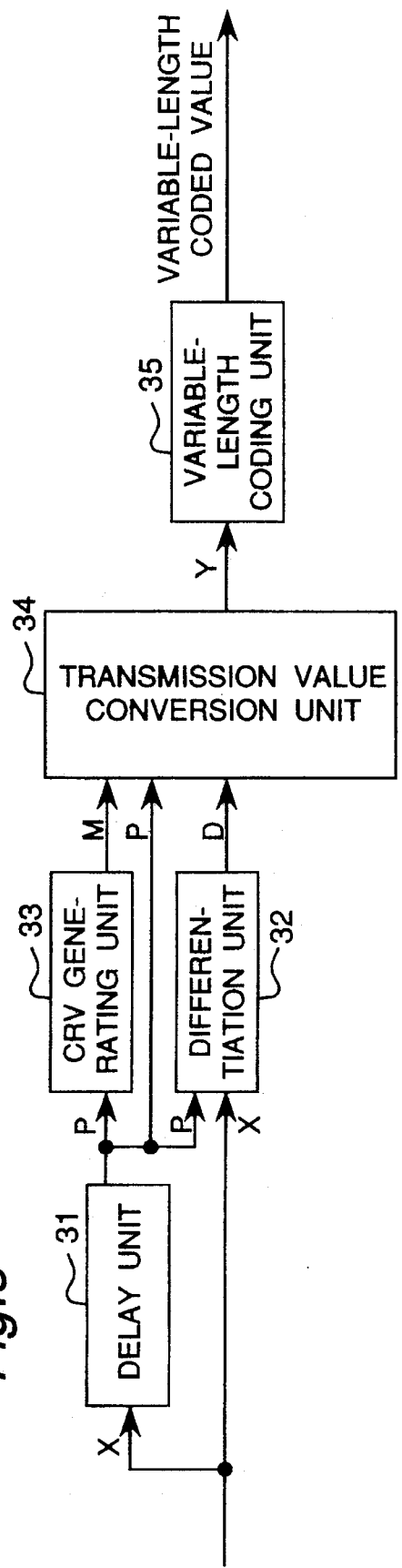
FIG. 3 is a block diagram of a differential coding apparatus in accordance with a first embodiment of the present invention.

The following describes a differential coding apparatus in accordance with a first embodiment of the present invention with reference to FIG. 3.

Referring to FIG. 3, reference numeral 31 denotes a delay unit, 32 a differentiation unit, 33 a conversion reference value generating unit (referred to as 'CRV generator' hereinafter), 34 a transmission value conversion unit, and 35 a variable-length coding unit.

First, an adjacent value P is stored in the delay unit 31 with receipt of an object value X to be currently coded. In the above process, when no adjacent value exists in such a case of the first value or the like, the adjacent value P is set 0. Then in the differentiation unit 32, a difference value D between the value X to be coded and the adjacent value P stored in the delay unit 31 is calculated according to the following equation:

$$D = X - P$$

In the conversion reference value (CRV) generating unit 33, assuming that the value X to be coded can exist in the range from $-N \leq X < N$ (i.e., $-N \leq X \leq N-1$), a conversion reference value M is obtained according to the equations as following:

$$M = N - 1 - P \text{ where } P \geq 0, \text{ and}$$

$$M = P - (-N) = N + P = N - (-PO) \text{ when } P < 0$$

where N is an integer equal to or greater than 1. According to the above equations, when P is positive ($P \geq 0$), the conversion reference value M is obtained by calculating a difference between the adjacent value (P) and the maximum positive value (N−1) in the range. When P is negative (P<0), the conversion reference value M is obtained by calculating a difference between the adjacent value (P) and the minimum negative value (−N) in the range. In other words, a distance from the value P to an end of the range closer to the value of P is obtained as a conversion reference value M. The examples of FIGS. 1 and 2 show the case where N is 16.

In the transmission value conversion unit 34, a difference value D is converted into a transmission value Y by assigning a transmission value Y to each difference value D with reference to the conversion reference value M according to the equations (1) and (2) as following:

$$\begin{aligned}
&\text{in the case where } P \geq 0, \quad &(1)\\
&Y = 2D &\text{when } D \geq 0,\\
&Y = -2D - 1 &\text{when } -M \leq D < 0, \text{ and}\\
&Y = -D + M &\text{in any other case, and}\\
\\
&\text{in the other case where } P < 0 \quad &(2)\\
&Y = -2D - 1 &\text{when } D < 0,\\
&Y = 2D &\text{when } 0 \leq D \leq M, \text{ and}\\
&Y = D + M &\text{in any other case.}
\end{aligned}$$

Through the D-to-Y conversion in the coding process according to the above equations, the transmission values of serial integers can be assigned to the all difference values in accordance with the ascending order of the absolute values of the difference values.

Finally, in the variable-length coding unit 35, the transmission values are converted into variable-length codes by giving a code having the shorter code length to the transmission value having the smaller value with reference to an appropriate coding table as shown in Table 1, where Table 1 shows a coding table for use in the variable-length coding unit. Thus, the code words have their code length being longer as the transmission value increases in number within a predetermined number of code words.

It is to be noted here that, although the transmission values are assigned successively from a negative one to a positive one of the difference values having the same absolute values in the present embodiment, the transmission values may be assigned successively from a positive one to a negative one.

Figure 4:
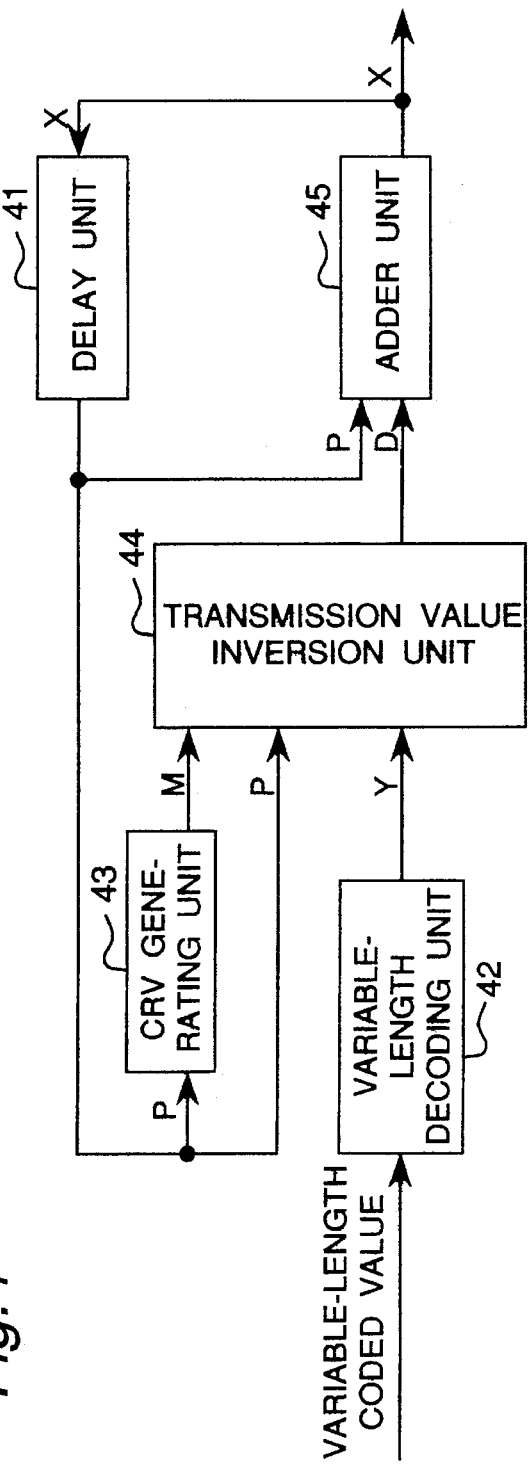
FIG. 4 is a block diagram of a differential decoding apparatus of the first embodiment.

FIG. 4 shows a block diagram of a differential decoding apparatus for decoding the value coded by the differential coding apparatus as shown in FIG. 3 of the first embodiment of the present invention.

In FIG. 4, reference numeral 41 denotes a delay unit, 42 a variable-length decoding unit, 43 a conversion reference value generating unit (referred to as 'CRV generating unit' hereinafter), 44 a transmission value inversion unit, and 45 an adder unit.

First, an adjacent value P is stored in the delay unit 41 with receipt of a value X. When no adjacent value exists in such a case of the first value or the like, the adjacent value is set 0. Then in the variable-length decoding unit 42, a variable-length decoding operation is performed with reference to an appropriate coding table as shown in Table 1 used in the variable-length coding operation to obtain a transmission value Y from a variable-length coded value. In the conversion reference value (CRV) generating unit 43, a conversion reference value M is obtained with receipt of the adjacent value P according to the following equations:

$M = N - 1 - P$ when $P \geq 0$, and $M = N + P$ when $P < 0$ where it is assumed that, N is an integer not smaller than 1, and the value X exists in the range of $-N \leq X < N$. The above equations are the same as in the coding process.

Further in the transmission value inversion unit 44, the difference value D is obtained by inversely converting the transmission value Y with reference to the values P and M according to the equations (3) and (4) as following:

in the case where $P \geq 0$, (3)

$D = Y/2$  when $Y \leq 2M$ and $Y$ is an even number;

$D = -(Y+1)/2$  when $Y \leq 2M$ and $Y$ is an odd number;

and $D = -Y + M$  in any other case, and in the case where $P < 0$, (4)

$D = Y/2$  when $Y \leq 2M$ and $Y$ is an even number;

$D = -(Y+1)/2$  when $Y \leq 2M$ and $Y$ is an odd number;

and $D = Y - M$  in any other case.

The above equations (3) and (4) are derived from the inversion of the equations (1) and (2) for conversion in the coding process.

Finally in the adder unit 45, a decoded value X is obtained by adding the values D and P according to the equation:

$X = D + P$.

Through the above coding and decoding operations, the range of the transmission values can be limited to the range in which the value to be coded exists, which allows the range of the transmission value to be reduced half although the range of the transmission value would be doubled by taking the difference value in the conventional method. Thus, there is an effect that the table for the variable-length coding of the difference value can be reduced in dimension.

Furthermore, each value can be coded at a high efficiency by performing the variable-length coding in which a code having the shorter code length is given to the difference value having the smaller absolute value in comparison with the conventional aliasing coding method represented by MPEG in which the code words are reduced half in number.

Second Embodiment

In the second embodiment, in order to simplify a hardware construction in the first embodiment, bit manipulation of a value of input data is employed to perform product-sum operations of a conversion reference value (CRV) generating unit and a transmission value conversion unit in the coding or decoding process.

The following describes a differential coding apparatus in accordance with the second embodiment of the present invention with reference to FIG. 5.

Referring to FIG. 5, reference numeral 51 denotes a delay unit, 52 a differentiation unit, 53 a conversion reference value (CRV) generating unit, 54 a transmission value conversion unit, and 55 a variable-length coding unit.

Table 1 shows a coding table for use in the variable-length coding unit 55, and when the value to be coded exists in a range from −16 to +15, the transmission value exists in a range from 0 to 31. In the present case, it is to be noted here that a code having the shorter code length is assigned as a variable-length code to the smaller transmission value.

The following describes the operation of the differential coding apparatus of the present embodiment with the following values represented by their bit data obtained through binary coding:

| | | | MSB LSB |
|---|---|---|---|
| P: Adjacent value ($-16 \leq P \leq 15$) | | 5 bits | ($P4, P3, P2, P1, P0$) |
| X: Value to be coded ($-16 \leq X \leq 15$) | | 5 bits | ($X4, X3, X2, X1, X0$) |
| D: Difference value ($-31 \leq D \leq 31$) | | 6 bits | ($D5, D4, D3, D2, D1, D0$) |
| M: Conversion reference value ($0 \leq M \leq 15$) | | 4 bits | ($M3, M2, M1, M0$) |
| Y: Transmission value ($0 \leq Y \leq 31$) | | 5 bits | ($Y4, Y3, Y2, Y1, Y0$) |

First, an adjacent value P is stored in the delay unit 51 with receipt of the value X to be coded. When no adjacent value exists in such a case of the first value or the like, the adjacent value P is set 0. Then in the differentiation unit 52, a difference value D between the value X to be coded and the adjacent value P stored in the delay unit 51 is obtained according to the following equation:

$D = X - P = (D5, D4, D3, D2, D1, D0)$.

In the conversion reference value (CRV) generating unit 53, the conversion reference value M is obtained according to the equations for conversion as follows:

$M = 15 - P = (!P3, 'P2, 'P1, !P0)$ when $P4 = 0$, and $M = 16 + P = (P3, P2, P1, P0)$ when $P4 = 1$ where P4 is a code bit of P.

Further in the transmission value conversion unit 54, the transmission value Y is obtained by converting the difference value D according to the equations:

in the case where $P4 = 0$, (5)

$Y = 2D = (D3, D2, D1, D0, 0)$ when $D \geq 0$;

$Y = -2D - 1 = (!D3, !D2, !D1, !D0, 1)$ when $-M \leq D < 0$; and $Y = -D + M = 15 - X = (X4, !X3, !X2, !X1, !X0)$ in any other case; and -continued in the case where $P4 = 1$, (6)

$$Y = -2D - 1 = (!D3, !D2, !D1, !D0, 1)$$
when $D < 0$;

$$Y = 2D = (D3, D2, D1, D0, 0)$$
when $0 \leq D \leq M$; and $$Y = D + M = 16 + X = (!X4, X3, X2, X1, X0)$$
in any other case.

Finally, in the variable-length coding unit 55, the transmission value Y is converted into a variable-length code by giving a code having the shorter code length to the smaller transmission value in number with reference to the variable-length coding table as shown in Table 1.

FIG. 6 shows a block diagram of a differential decoding apparatus for decoding the value coded by the differential coding apparatus as shown in FIG. 5 in accordance with the second embodiment of the present invention.

In FIG. 6, reference numeral 61 denotes a delay unit, 62 a variable-length decoding unit, 63 a conversion reference value (CRV) generating unit, 64 a transmission value inversion unit, 65 an adder unit, and 66 and 67 switches.

First, an adjacent value P is stored in the delay unit 61 with receipt of a value X to be processed. When no adjacent value exists in such a case of the first value or the like, the adjacent value is set 0. Then in the variable-length decoding unit 62, a variable-length decoding operation is performed for decoding a variable length coded data with reference to the coding table shown in Table 1 used in the variable-length coding operation. In the conversion reference value (CRV) generating unit 63, the conversion reference value M is obtained with receipt of the adjacent value P according to the equations for conversion as follows:

$$M=15-P=(!P3, !P2, !P1, !P0) \text{ when } P4 \geq 0, \text{ and}$$

$$M=16+P=(P3, P2, P1, P0) \text{ when } P4<0$$

Further in the transmission value inversion unit 64, a difference value D and a value X to be processed are obtained by inversely converting the transmission value Y according to the following equations (7) and (8):

in the case where $P4 = 0$, (7)

$$D = Y/2 = (0, Y4, Y3, Y1)$$
when $Y \leq 2M$ and $Y0 = 0$;

$$D = -(Y+1)/2 = (1, !Y4, !Y3, !Y2, !Y1)$$
when $Y \leq 2M$ and $Y0 = 1$; and $$X = -Y + 15 = (Y4, !Y3, !Y2, !Y1, !Y0)$$
in any other case; and in the case where $P4 = 1$, (8)

$$D = Y/2 = (0, Y4, Y3, Y2, Y1)$$
when $Y \leq 2M$ and $Y0 = 0$;

$$D = -(Y+1)/2 = (1, !Y4, !Y3, !Y2, !Y1)$$
when $Y \leq 2M$ and $Y0 = 1$; and $$X = -16 + Y = (!Y4, Y3, Y2, Y1, Y0)$$
in any other case.

In the equations, it is noted here that Y0 is the least significant bit for distinguishing the case where Y is an even value from the case where Y is an odd value.

In the above place, when $Y \leq 2M$, the output of the transmission value inversion unit 64 is electrically connected to an input of the adder unit 65 by means of the switches 66 and 67. Subsequently, when $Y \leq 2M$, the difference value D is added to the adjacent value P by means of the adder unit 65 to obtain a decoded value X according to the equation:

$$X=D+P$$

On the other hand, in the case of $Y>2M$, the output of the transmission value inversion unit 64 is directly used as the decoded value X without connecting the output of the transmission value inversion unit 64 to the input of the adder unit 65 by changeover of the switches 66 and 67.

Table 2 shows a case where P=+5; while Table 3 shows a case where P=–12.

Referring to Table 2, since a code bit P4 of the adjacent value P is 0, the conversion reference value M is 15–P=10. Since the absolute value of the difference value D is not greater than 10 when the value X to be coded is in the range from –5 to +15, a transmission value of 0 is first assigned to the difference value of 0, and then transmission values 1 to 20 are alternately assigned to the negative and positive difference values successively from negative one to positive one in the order of ascending the absolute values of the difference values. Thus, in the present case, serial numbers 0 through 20 are assigned as the transmission values to the difference values when the absolute value of the difference value D is within the range of 10 which is selected as the conversion reference value M.

When the value X to be coded is in the range from –16 to –6, transmission values are successively assigned to the difference values in the order of ascending the absolute values of the difference values. In more detail, serial numbers of 21 through 31 are assigned as transmission values to the difference values of –11 through –21 respectively.

Referring to Table 3 in the case of P=–12, since a code bit P4 of the adjacent value P is 1, the conversion reference value M is 16+P=4. When the value X to be coded is in a range from –16 to –8, the absolute value of the difference value D is not greater than the conversion reference value (in this case, M=4). Therefore, a transmission value of 0 is first assigned to the difference value of 0, and then transmission values 1 through 8 are alternately assigned to the negative and positive difference values successively from the negative one to the positive one in the order of ascending the absolute values of the difference values. In this range, serial numbers 0 through 8 of the transmission values are assigned to the negative and positive difference values alternately.

When the value X to be coded is in the range from –7 to +15, serial numbers 9 through 31 of transmission values are successively assigned to the difference values in the order of ascending the absolute values of the difference values. In more detail, numbers of 9 through 31 are assigned as transmission values to the difference values 5 through 27 respectively.

As described above, by utilizing the coding apparatus in the present embodiment, the number of code words of the transmission values can be limited to 32 which is equal to that of the values to be coded, which allows the number of code words to be reduced half compared to conventional one in which the number of the code words would be approximately doubled to 63. Thus, the table for variable-length coding of the difference value can be dimensionally reduced.

Furthermore, the variable-length code is allowed to have a shorter code length in the order in which the difference value is reducing in absolute value as compared with the performance in the conventional aliasing coding method in which the code words are reduced in number by half. Therefore, the value X can be coded at a high efficiency.

Furthermore, since the product-sum operations of the conversion reference value (CRV) generating unit 53 and the transmission value conversion unit 54 in the coding process or the product-sum operations of the conversion reference value (CRV) generating unit 63 and the transmission value conversion unit 64 in the decoding process can be achieved through bit manipulation of an input value, a simplified hardware construction can be achieved.

Third Embodiment

In contrast to the first embodiment of the differential coding apparatus employing the conversion reference value (CRV) generating unit, the third embodiment of a differential coding apparatus has a construction requiring no conversion reference value.

Figure 7:
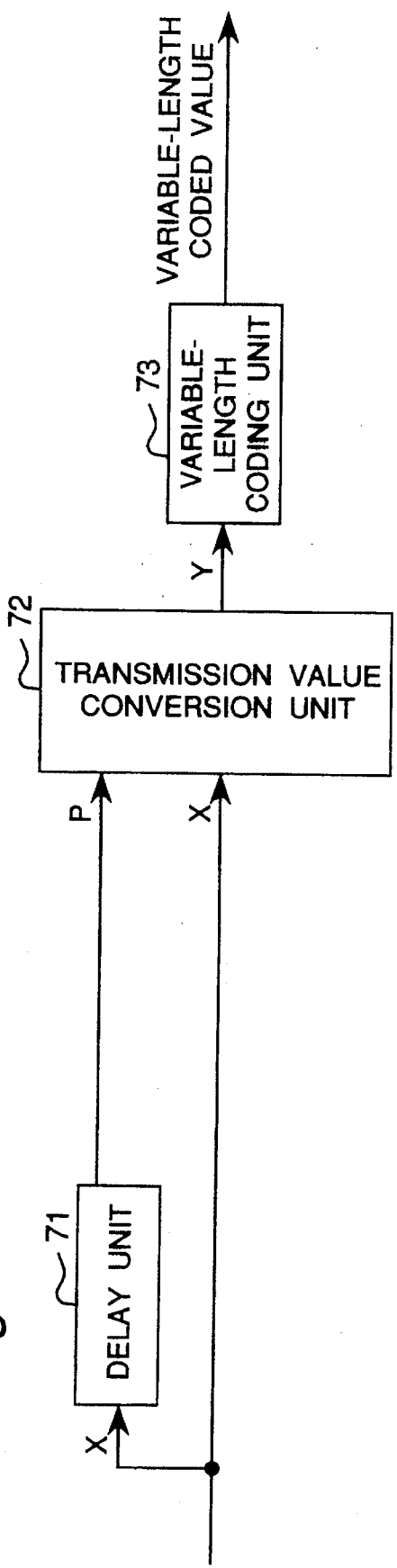
FIG. 7 is a block diagram of a differential coding apparatus in accordance with a third embodiment of the present invention.
Figure 8:
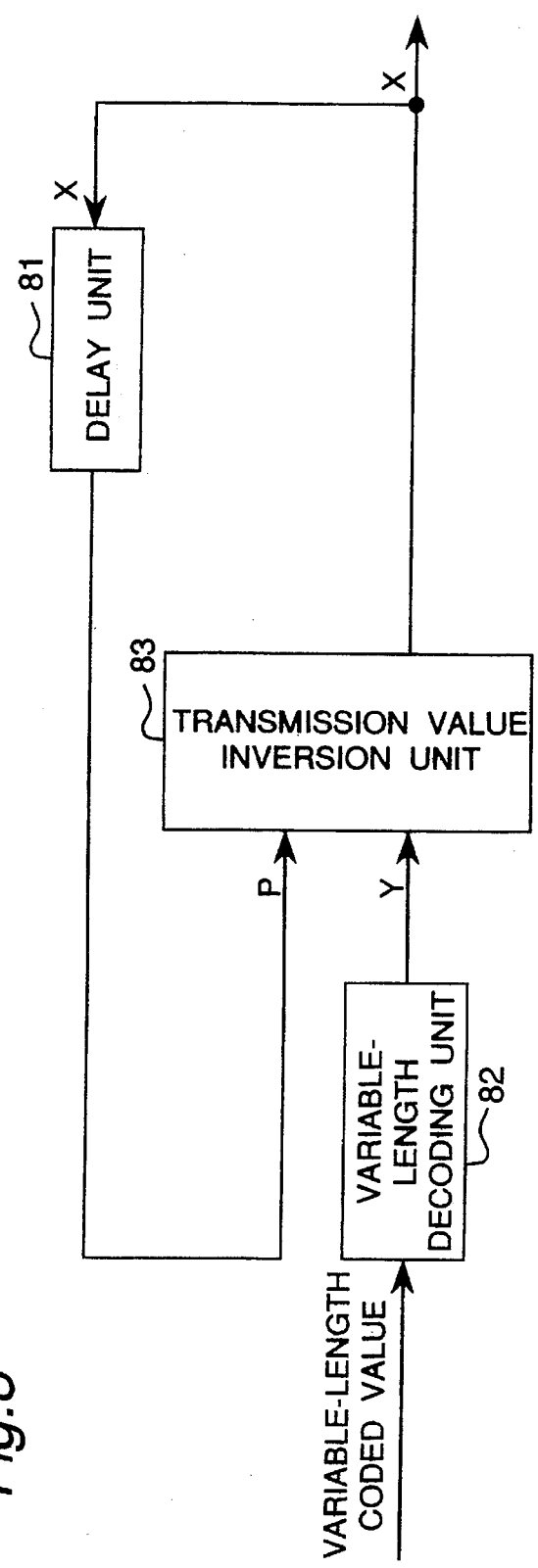
FIG. 8 is a block diagram of a differential decoding apparatus of the third embodiment.

The following describes a differential coding apparatus in accordance with the third embodiment of the present invention with reference to FIGS. 7 and 8.

In FIG. 7, reference numeral 71 denotes a delay unit, 72 a transmission value conversion unit, and 73 a variable-length coding unit.

First, an adjacent value P is stored in the delay unit 71 with receipt of the value X to be coded. When no adjacent value exists in such a case of the first value or the like, the adjacent value P is set 0.

Then in the transmission value conversion unit 72, a transmission value Y is assigned to each difference value (X–P) with reference to Tables 5 and 6 according to the following equations (9) and (10), assuming that the transmission value Y is in the range of $-N \leq Y < N$ (N: positive integer):

(9) in the case where $P \geq 0$, $Y = (N-1-X)/2$
  when $(X \leq 2P - N)$ and ($X$ is an odd number);
$Y = -(N-X)/2$
  when $(X \leq 2P - N)$ and ($X$ is an even number); and
$Y = X - P$ in any other case, and

(10) in the case where $P < 0$, $Y = (N+X)/2$
  when $(X > 2P + N)$ and ($X$ is an even number),
$Y = -(N+1+X)/2$
  when $(X > 2P + N)$ and ($X$ is an odd number), and
$Y = X - P$ in any other case where an example of the case of equations (9) is shown in Table 5, while an example of the case of equations (10) is shown in Table 6.

Through the conversion according to the above equations, among the entire difference values which can exist in coding, a part of the difference values within the range of having both the positive and negative values is directly assigned to the transmission value Y. In more detail, for example, as shown in Table 5, when the value X is in a range of –5 to 15, the difference value ranges from –10 to +10 having both positive and negative values, and therefore the transmission values –10 through +10 are directly used as the difference values.

On the other hand, when the difference value is in the range having any one part of positive or negative values, the transmission value Y can be assigned alternately to each negative and positive difference value successively from the negative one to positive one in the order of ascending the absolute values of the difference values. In more detail, for example, as shown in Table 5, when the value X is in a range of –6 through –16, the difference value ranges from –11 to –21 having only a negative part, and therefore a pair of negative and positive transmission values –11 and +11 are respectively assigned to the difference values of –11 and –12. Similarly, transmission values of (–12, +12), . . . (–15, 15) and –16 are successively assigned to the difference values of (–13, –14), . . . (–19, –20) and –21 respectively.

Similarly in the case where P<0 as shown in Table 6, when the value X to be coded is in the range from –7 to 15, negative and positive values are alternately assigned as the transmission values in the order of –5, +5, . . . , –15, +15, and –16. When the value X to be coded is in the range from –8 to –16, each difference value is directly assigned as each transmission value as it is.

In other words, the transmission value Y is assigned to the difference value so that the transmission value Y increases in absolute value according as the difference value increases in absolute value in the entire range of the difference value.

Finally, by means of the variable-length coding unit 73, a code having the shorter code length is assigned to a transmission value having the smaller absolute value in the order of ascending the absolute value of the transmission value Y using a coding table as shown in Table 4.

FIG. 8 shows a block diagram of a differential decoding apparatus for decoding the value coded by the differential coding apparatus as shown in FIG. 7 of the third embodiment of the present invention.

In FIG. 8, reference numeral 81 denotes a delay unit, 82 a variable-length decoding unit, and 83 a transmission value inversion unit.

First, an adjacent value P is stored in the delay unit 81 with receipt of a value X to be processed. When no adjacent value exists in such a case of the first value or the like, adjacent value is set 0.

Then, in the variable-length decoding unit 82, a variable-length decoding operation is performed to obtain a transmission value Y by decoding a variable-length coded data using the above-mentioned coding table as shown in Table 4 used in the variable-length coding operation.

Finally, by means of the transmission value inversion unit 83, the transmission value Y is inversely converted into the value X with reference to the above conversion Tables 5 and 6 according to the following equations. Assuming that the transmission value is in the range of $-N \leq Y < N$ (N: positive integer),

(11) in the case where $P \geq 0$, $X = -2Y + N - 1$   when $Y > N - 1 - P$;
$X = 2Y + N$   when $Y \leq -N + P$; and
$X = Y + P$   in any other case, and

(12) in the case where $P < 0$, $X = 2Y - N$   when $Y > N + P$;
$X = -2Y - N - 1$   when $Y \leq -N - 1 - P$; and
$X = Y + P$   in any other case, where an example of the case of equations (11) is shown in Table 5, while an example of the case of equations (12) is shown in Table 6. The above equations (11) and (12) for decoding are respectively derived through inversion of the equations (9) and (10) for conversion in coding.

By effecting the coding or decoding operation as described above, the same coding or decoding as in the first embodiment can be performed without utilizing the conversion reference value used in the first embodiment.

In addition, since there is no need to provide any conversion reference value (CRV) generating circuit in the differential coding apparatus, circuit scale thereof can be further reduced in the present embodiment than in the first embodiment.

Fourth embodiment

In the fourth embodiment, in order to simplify a hardware construction in the third embodiment, bit manipulation of a value of input data is employed to perform product-sum operation of a transmission value conversion unit in the coding or decoding process.

In contrast to the second embodiment employing the conversion reference value generating unit, the present embodiment provides a differential coding apparatus having a construction requiring no conversion reference value.

Figure 9:
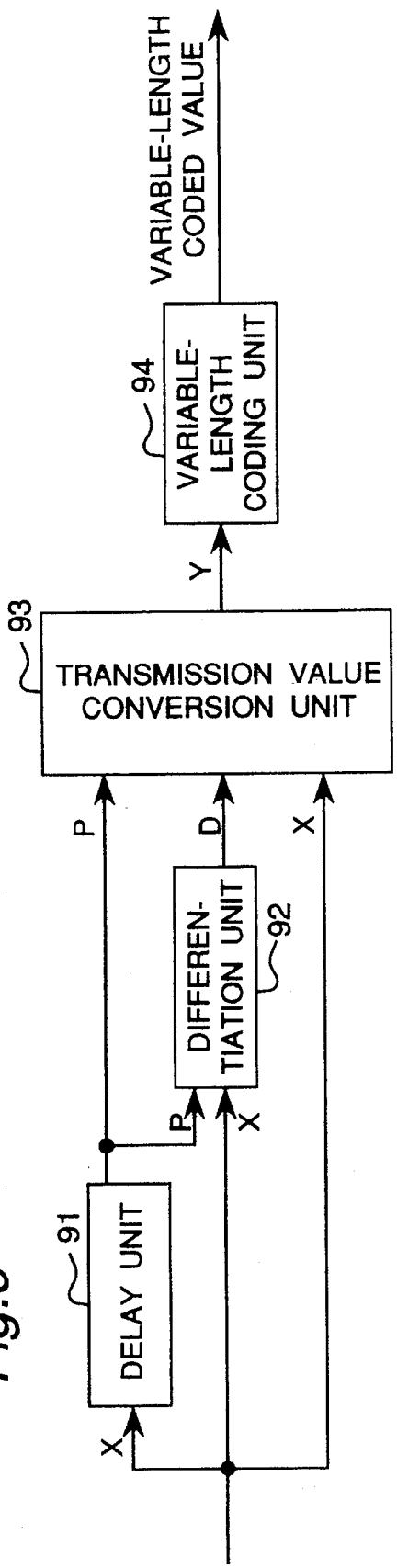
FIG. 9 is a block diagram of a differential coding apparatus in accordance with a fourth embodiment of the present invention.
Figure 10:
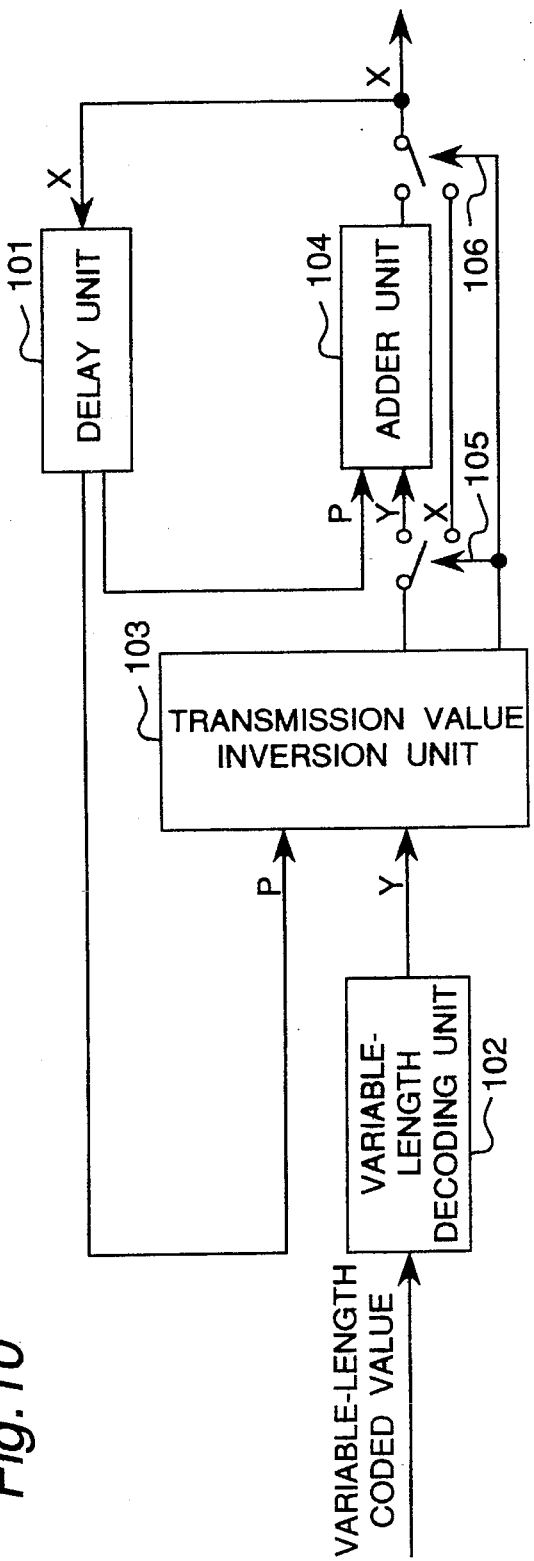
FIG. 10 is a block diagram of a differential decoding apparatus of the fourth embodiment.
Figure 11:
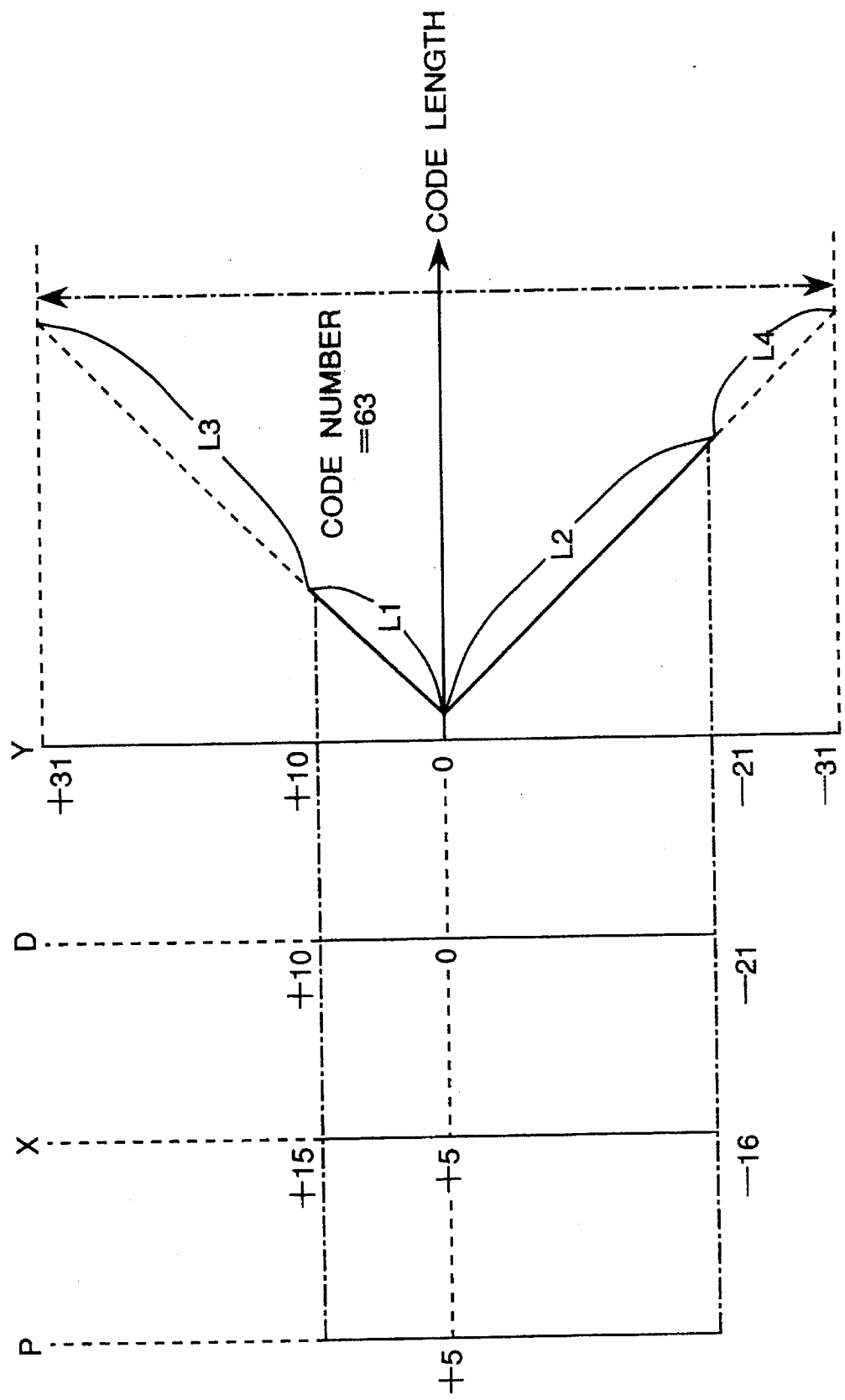
FIG. 11 is an explanatory view of a method for composing code words in accordance with a conventional differential coding method.
Figure 12:
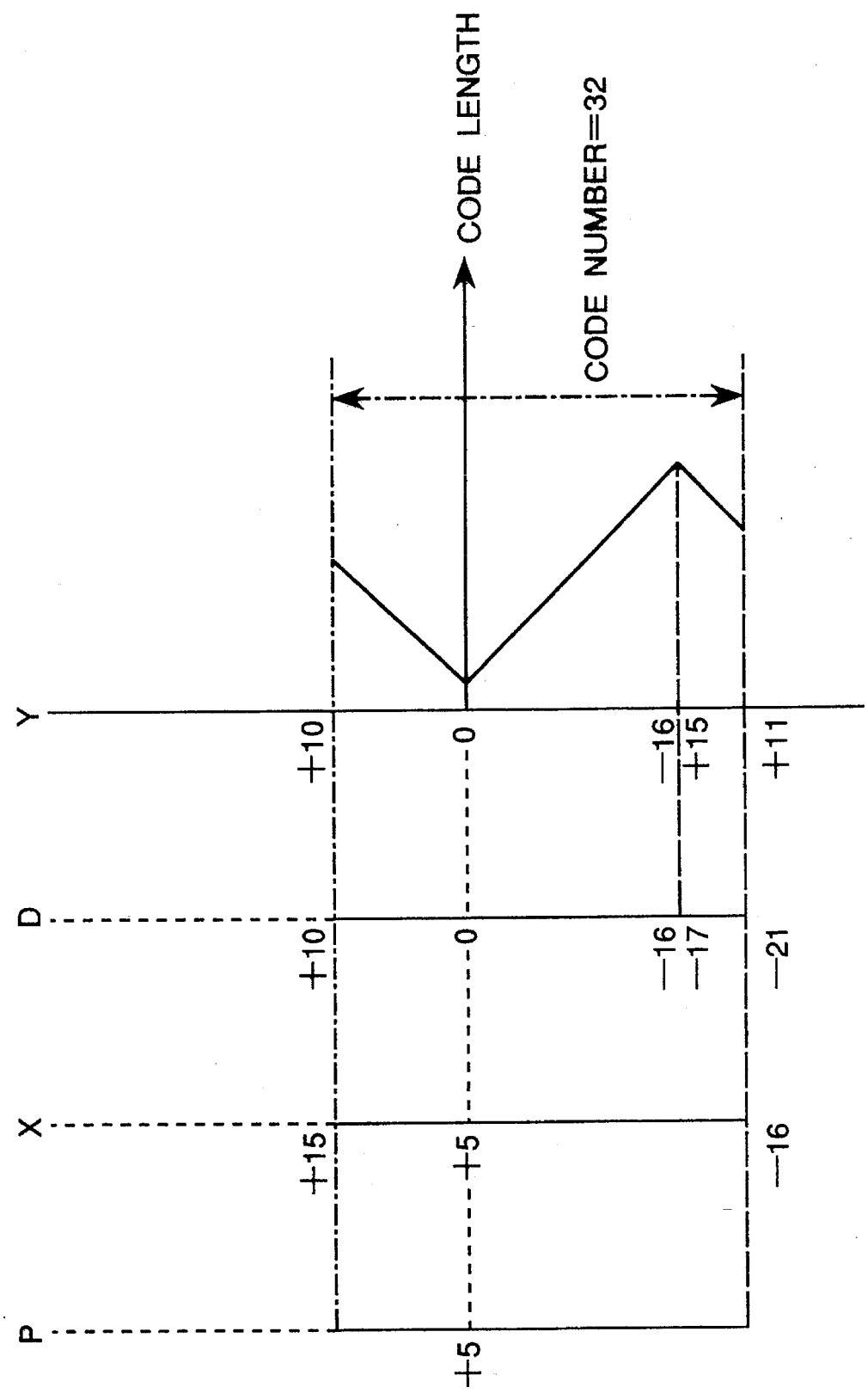
FIG. 12 is an explanatory view of a method for composing code words in accordance with the aliasing coding method.
Figure 13:
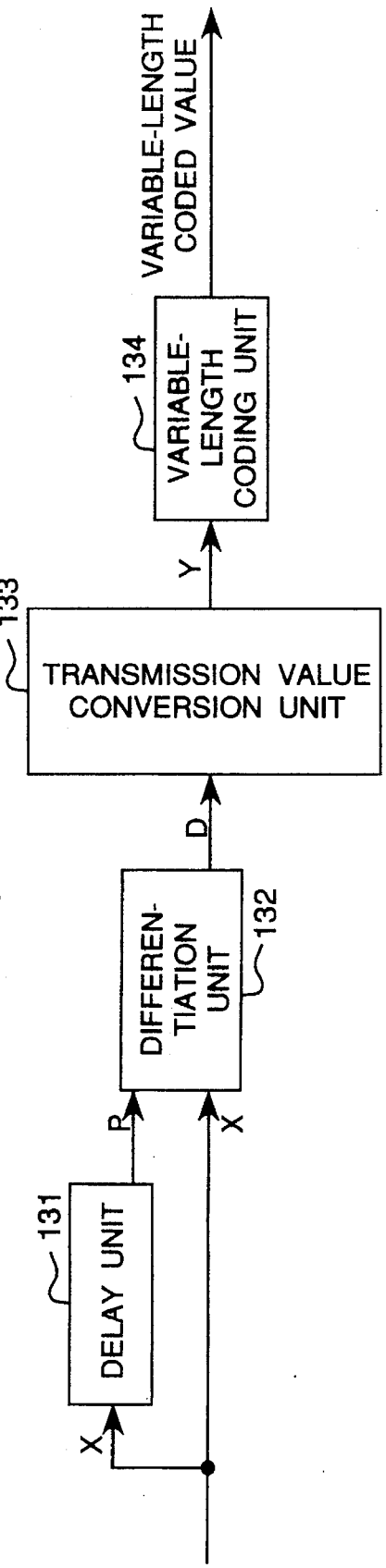
FIG. 13 is an explanatory view of a conventional differential coding apparatus.
Figure 14:
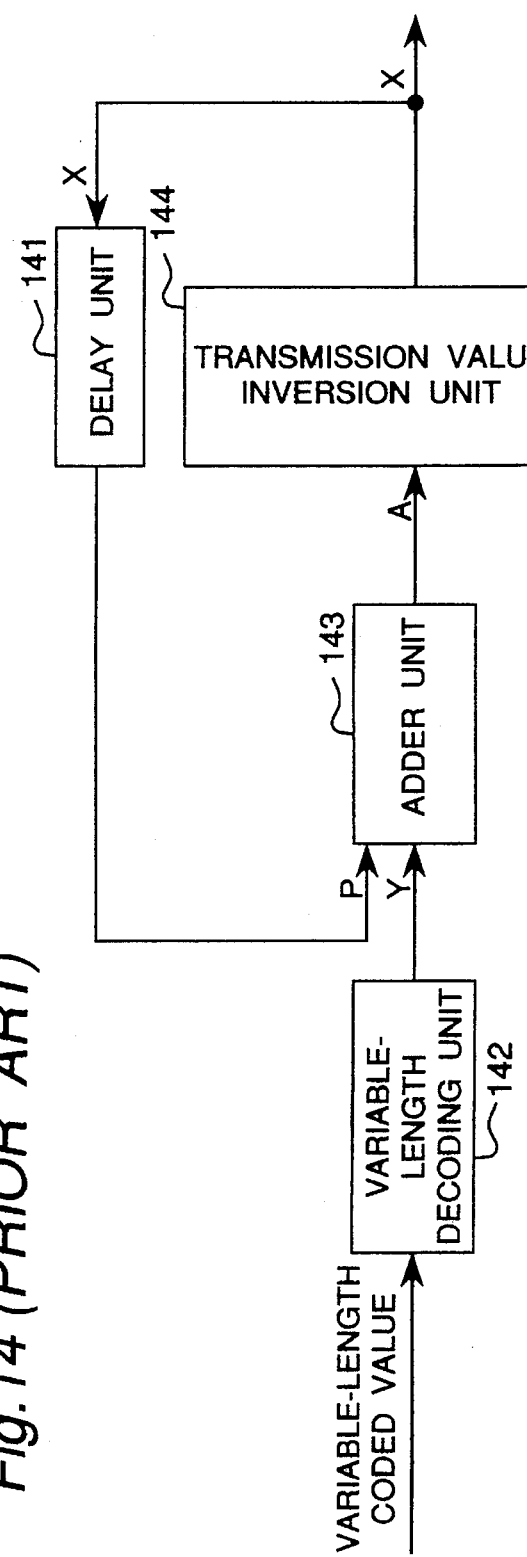
FIG. 14 is an explanatory view of a conventional differential decoding apparatus.

The following describes a differential coding apparatus in accordance with the fourth embodiment of the present invention with reference to FIGS. 9 and 10.

In FIG. 9, reference numeral 91 denotes a delay unit, 92 a differentiation unit, 93 a transmission value conversion unit, and 94 a variable-length coding unit.

Table 4 is a coding table for use in the variable-length coding unit 94. The value to be coded can exist in a range from −16 to +15, while the transmission value can also exist in a range from −16 to +15. In the present case, a code having the shorter code length is assigned as a variable-length code to the transmission value having the smaller absolute value.

The following describes the operation of the differential coding apparatus of the present embodiment using the following values and their bit data obtained through binary coding.

| | | MSB | LSB |
|---|---|---|---|
| P: | Adjacent value | | |
| | ($-16 \leq P \leq 15$) 5 bits | ($P4, P3, P2, P1, P0$) | |
| X: | Value to be coded | | |
| | ($-16 \leq X \leq 15$) 5 bits | ($X4, X3, X2, X1, X0$) | |
| D: | Difference value | | |
| | ($-31 \leq D \leq 31$) 6 bits | ($D5, D4, D3, D2, D1, D0$) | |
| Y: | Transmission value | | |
| | ($-16 \leq Y \leq 15$) 5 bits | ($Y4, Y3, Y2, Y1, Y0$) | |

First, an adjacent value P is stored in the delay unit 91 with receipt of the value X to be coded. When no adjacent value exists in such a case of the first value or the like, the adjacent value is set 0.

Then, by means of the differentiation unit 92, a difference value D between the value X to be coded and the adjacent value P stored in the delay unit 91 is obtained according to the following equation:

$$D = X - P = (D5, D4, D3, D2, D1, D0)$$

Further, in the transmission value conversion means 93, a transmission value Y is obtained by converting the difference value D with reference to values X and P as shown in Tables 5 and 6 according to the following equations:

(13) in the case where $P4 = 0$, $Y = (15 - X)/2 = (0, X4, !X3, !X2, !X1)$
   when $X \leq (2P - 16 = (!P3,P2,P1,P0,0))$ and $X0 = 1$;

$Y = -(16 - X)/2 = (1, !X4, X3, X2, X1)$
   when $X \leq (2P - 16 = (!P3,P2,P1,P0,0))$ and $X0 = 0$;
and $Y = D = (D5, D4, D3, D2, D1, D0)$
   in any other case, and

(14) in the case where $P4 = 1$, $Y = (16 + X)/2 = (0, !X4, X3, X2, X1)$
   when $X > (2P + 16 = (!P3,P2,P1,P0,0))$ and $X0 = 0$;

$Y = -(17 + X)/2 = (1, X4, !X3, !X2, !X1)$
   when $X > (2P + 16 = (!P3,P2,P1,P0,0))$ and $X0 = 1$;
and $Y = D = (D5, D4, D3, D2, D1, D0)$
   in any other case.

Finally, by means of the variable-length coding unit 94, each transmission value Y is converted into a variable-length code by giving a code having the shorter code length to the transmission value having the smaller absolute value using the variable-length coding table as shown in Table 4.

FIG. 10 shows a block diagram of a differential decoding apparatus for decoding the value coded by the differential coding apparatus as shown in FIG. 9 of the fourth embodiment of the present invention.

In FIG. 10, reference numeral 101 denotes a delay unit, 102 a variable-length decoding unit, 103 a transmission value inversion unit, and 104 an adder unit.

First, an adjacent value P is stored in the delay unit 101 with receipt of the value X to be processed. When no adjacent value exists in such a case of the first value or the like, the adjacent value is set 0.

Then, by means of the variable-length decoding unit 102, a variable-length coded data is decoded with reference to the variable-length coding table as shown in Table 4.

Further, in the transmission value inversion unit and the adder unit 104, the difference value and the value X to be processed are obtained using the values P and Y as shown in Tables 5 and 6 according to the following equations:

(15) in the case where $P4 = 0$, $X = -2Y + 15 = (Y3, !Y2, !Y1, !Y0, 1)$
   when $Y > (15 - P = (0,!P3,!P2,!P1,!P0))$;

$X = 2Y + 16 = (!Y3, Y2, Y1, Y0, 0)$
   when $Y \leq (-16 + P = (1, P3, P2, P1, P0))$; and Y is output as it is in any other case, and

(16) in the case where $P4 = 1$, $X = 2Y - 16 = (!Y3, Y2, Y1, Y0, 0)$
   when $Y > (16 + P = (0, P3, P2, P1, P0))$;

$X = -2Y - 17 = (Y3, !Y2, !Y1, !Y0, 1)$
   when $Y \leq (-17 - P = (1,!P3,!P2,!P1,!P0))$; and Y is output as it is in any other case.

In the present case, when Y is output as it is from the transmission value inversion unit 103, an output of the transmission value inversion unit 103 is electrically connected to an input of the adder unit 104 by means of switches 105 and 106. In any other case, the output of the transmission value inversion unit 103 is not connected to the input of the adder unit 104.

Finally, when Y is output as it is from the transmission value inversion unit 103, the value Y is added to the adjacent value P to obtain a decoded vale X by means of the adder unit 104 according to the following equation:

$$X = Y + P$$

Table 5 shows a case where P=5, Table 6 shows a case where P=−12.

In the case where P4=0 as shown in Table 5, when the value X to be coded is in the range of −6 to −16, negative and positive values in the order of −11, +11, . . . , −15, +15, −16 are alternately assigned as the transmission values. When the value X to be coded is in the range from −5 to 15, each difference value (X−P) is directly assigned to each transmission value.

Similarly in the case where P4=1 as shown in Table 6, when the value X to be coded is in the range from −7 to 15, negative and positive values are alternately assigned as the transmission values in the order of −5, +5, ..., −15, +15, and −16. When the value X to be coded is in the range from −8 to −16, each difference value is directly assigned as each transmission value as it is.

By effecting the coding operation as described above, the same coding operation as in the second embodiment can be achieved without utilizing the conversion reference value employed in the second embodiment. In addition, since there is no need to provide any conversion reference value generating circuit in the differential coding apparatus, circuit scale can be further reduced in the present embodiment than in the second embodiment.

As the adjacent value described in each of the first embodiment through the fourth embodiment, there may be utilized a spatially adjoining value such as a value of an adjacent block or a value of a block corresponding to the same position in the previous frame of video data other than the timely adjoining value such as the previously coded value. When a plurality of adjacent values exist, a value calculated from the values through a certain calculation may be used as an adjacent value.

Note that the equations for conversion and inversion used in the differential coding method and apparatus of the first embodiment through the fourth embodiment are the representative ones, and therefore other equations may be used to execute the same operation.

The differential coding method and apparatus as described in the first embodiment through the fourth embodiment are highly effective when utilized in differential coding of a motion vector. The method and apparatus are also effective when utilized in differential coding of any time series signal other than the motion vector.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

TABLE 1

| Transmission value | Code length | Variable-length code |
|---|---|---|
| 0 | 1 | 1 |
| 1 | 3 | 011 |
| 2 | 3 | 010 |
| 3 | 4 | 0011 |
| 4 | 4 | 0010 |
| 5 | 5 | 0001 1 |
| 6 | 5 | 0001 0 |
| 7 | 7 | 0000 111 |
| 8 | 7 | 0000 110 |
| 9 | 8 | 0000 1011 |
| 10 | 8 | 0000 1010 |
| 11 | 8 | 0000 1001 |
| 12 | 8 | 0000 1000 |
| 13 | 8 | 0000 0111 |
| 14 | 8 | 0000 0110 |
| 15 | 10 | 0000 0101 11 |
| 16 | 10 | 0000 0101 10 |
| 17 | 10 | 0000 0101 01 |
| 18 | 10 | 0000 0101 00 |
| 19 | 10 | 0000 0100 11 |

TABLE 1-continued

| Transmission value | Code length | Variable-length code |
|---|---|---|
| 20 | 10 | 0000 0100 10 |
| 21 | 11 | 0000 0100 011 |
| 22 | 11 | 0000 0100 010 |
| 23 | 11 | 0000 0100 001 |
| 24 | 11 | 0000 0100 000 |
| 25 | 11 | 0000 0011 111 |
| 26 | 11 | 0000 0011 110 |
| 27 | 11 | 0000 0011 101 |
| 28 | 11 | 0000 0011 100 |
| 29 | 11 | 0000 0011 011 |
| 30 | 11 | 0000 0011 010 |
| 31 | 11 | 0000 0011 001 |

TABLE 2

<When P = 5>

X: Value to be processed
P: Adjacent value     $D = X - P$
D: Difference value
Y: Transmission value     $M = 15 - P$
M: Conversion reference value

| P | X | D | Y | M | |
|---|---|---|---|---|---|
| 5 | 15 | 10 | 20 | 10 | Coding |
|   | 14 | 9 | 18 |  | $Y = 2D$ |
|   | 13 | 8 | 16 |  | Decoding |
|   | 12 | 7 | 14 |  | $X = Y/2 + P$ |
|   | 11 | 6 | 12 |  | |
|   | 10 | 5 | 10 |  | |
|   | 9 | 4 | 8 |  | |
|   | 8 | 3 | 6 |  | |
|   | 7 | 2 | 4 |  | |
|   | 6 | 1 | 2 |  | |
|   | 5 | 0 | 0 |  | |
|   | 4 | −1 | 1 |  | Coding |
|   | 3 | −2 | 3 |  | $Y = -2D - 1$ |
|   | 2 | −3 | 5 |  | Decoding |
|   | 1 | −4 | 7 |  | $X = (Y + 1)/2 + P$ |
|   | 0 | −5 | 9 |  | |
|   | −1 | −6 | 11 |  | |
|   | −2 | −7 | 13 |  | |
|   | −3 | −8 | 15 |  | |
|   | −4 | −9 | 17 |  | |
|   | −5 | −10 | 19 |  | |
|   | −6 | −11 | 21 |  | Coding |
|   | −7 | −12 | 22 |  | $Y = 15 - X$ |
|   | −8 | −13 | 23 |  | Decoding |
|   | −9 | −14 | 24 |  | $X = 15 - Y$ |
|   | −10 | −15 | 25 |  | |
|   | −11 | −16 | 26 |  | |
|   | −12 | −17 | 27 |  | |
|   | −13 | −18 | 28 |  | |
|   | −14 | −19 | 29 |  | |
|   | −15 | −20 | 30 |  | |
|   | −16 | −21 | 31 |  | |

TABLE 3

<When P = −12>

X: Value to be processed
P: Adjacent value     $D = X - P$
D: Difference value
Y: Transmission value     $M = 16 + P$
M: Conversion reference value

| P | X | D | Y | M | |
|---|---|---|---|---|---|
| −12 | 15 | 27 | 31 |  | Coding |
|   | 14 | 26 | 30 |  | $Y = 16 + X$ |
|   | 13 | 25 | 29 |  | Decoding |
|   | 12 | 24 | 28 |  | $X = 16 + Y$ |
|   | 11 | 23 | 27 |  | |

TABLE 3-continued

<When P = −12>
X: Value to be processed
P: Adjacent value       D = X − P
D: Difference value
Y: Transmission value   M = 16 ÷ P
M: Conversion reference value

| P | X | D | Y | M | |
|---|---|---|---|---|---|
|  | 10 | 22 | 26 | | |
|  | 9 | 21 | 25 | | |
|  | 8 | 20 | 24 | | |
|  | 7 | 19 | 23 | | |
|  | 6 | 18 | 22 | | |
|  | 5 | 17 | 21 | | |
|  | 4 | 16 | 20 | | |
|  | 3 | 15 | 19 | | |
|  | 2 | 14 | 18 | | |
|  | 1 | 13 | 17 | | |
|  | 0 | 12 | 16 | | |
|  | −1 | 11 | 15 | | |
|  | −2 | 10 | 14 | | |
|  | −3 | 9 | 13 | | |
|  | −4 | 8 | 12 | | |
|  | −5 | 7 | 11 | | |
|  | −6 | 6 | 10 | | |
|  | −7 | 5 | 9 | | |
|  | −8 | 4 | 8 | | Coding |
|  | −9 | 3 | 6 | | Y = 2D |
|  | −10 | 2 | 4 | | Decoding |
|  | −11 | 1 | 2 | | X = Y/2 + P |
|  | −12 | 0 | 0 | | |
|  | −13 | −1 | 1 | | Coding |
|  | −14 | −2 | 3 | | Y = −2D − 1 |
|  | −15 | −3 | 5 | | Decoding |
|  | −16 | −4 | 7 | 4 | X = −(Y + 1)/2 + P |

TABLE 4

| Transmission value | Code length | Variable-length code |
|---|---|---|
| 0 | 1 | 1 |
| 1 | 3 | 011 |
| −1 | 3 | 010 |
| −2 | 4 | 0011 |
| 2 | 4 | 0010 |
| −3 | 5 | 0001 1 |
| 3 | 5 | 0001 0 |
| −4 | 7 | 0000 111 |
| 4 | 7 | 0000 110 |
| −5 | 8 | 0000 1011 |
| 5 | 8 | 0000 1010 |
| −6 | 8 | 0000 1001 |
| 6 | 8 | 0000 1000 |
| −7 | 8 | 0000 0111 |
| 7 | 8 | 0000 0110 |
| −8 | 10 | 0000 0101 11 |
| 8 | 10 | 0000 0101 10 |
| −9 | 10 | 0000 0101 01 |
| 9 | 10 | 0000 0101 00 |
| −10 | 10 | 0000 0100 11 |
| 10 | 10 | 0000 0100 10 |
| −11 | 11 | 0000 0100 011 |
| 11 | 11 | 0000 0100 010 |
| −12 | 11 | 0000 0100 001 |
| 12 | 11 | 0000 0100 000 |
| −13 | 11 | 0000 0011 111 |
| 13 | 11 | 0000 0011 110 |
| −14 | 11 | 0000 0011 101 |
| 14 | 11 | 0000 0011 100 |
| −15 | 11 | 0000 0011 011 |
| 15 | 11 | 0000 0011 010 |
| −16 | 11 | 0000 0011 001 |

TABLE 5

<When P = 5>
X: Value to be processed
P: Adjacent value
Y: Transmission value

| P | X | Y | |
|---|---|---|---|
| 5 | 15 | 10 | Coding |
|  | 14 | 9 | Y = X − P |
|  | 13 | 8 | Decoding |
|  | 12 | 7 | X = Y + P |
|  | 11 | 6 | |
|  | 10 | 5 | |
|  | 9 | 4 | |
|  | 8 | 3 | |
|  | 7 | 2 | |
|  | 6 | 1 | |
|  | 5 | 0 | |
|  | 4 | −1 | |
|  | 3 | −2 | |
|  | 2 | −3 | |
|  | 1 | −4 | |
|  | 0 | −5 | |
|  | −1 | −6 | |
|  | −2 | −7 | |
|  | −3 | −8 | |
|  | −4 | −9 | |
|  | −5 | −10 | |
|  | −6 | −11 | Coding |
|  | −7 | 11 | When X = Odd number |
|  | −8 | −12 | Y = (15 − X)/2 |
|  | −9 | 12 | When X = Even number |
|  | −10 | −13 | Y = −(16 − X)/2 |
|  | −11 | 13 | Decoding |
|  | −12 | −14 | When Y > 15 − P |
|  | −13 | 14 | X = −2Y + 15 |
|  | −14 | −15 | When Y <= −16 + P |
|  | −15 | 15 | X = 2Y + 16 |
|  | −16 | −16 | |

TABLE 6

<When P = −12>
X: Value to be processed
P: Adjacent value
Y: Transmission value

| P | X | Y | |
|---|---|---|---|
|  | 15 | −16 | Coding |
|  | 14 | 15 | When X = Even number |
|  | 13 | −15 | Y = (16 + X)/2 |
|  | 12 | 14 | When X = Odd number |
|  | 11 | −14 | Y = −(17 + X)/2 |
|  | 10 | 13 | Decoding |
|  | 9 | −13 | When Y > 16 + P |
|  | 8 | 12 | X = 2Y − 16 |
|  | 7 | −12 | When Y <= −17 − P |
|  | 6 | 11 | X = 2Y − 17 |
|  | 5 | −11 | |
|  | 4 | 10 | |
|  | 3 | −10 | |
|  | 2 | 9 | |
|  | 1 | −9 | |
|  | 0 | 8 | |
|  | −1 | −8 | |
|  | −2 | 7 | |
|  | −3 | −7 | |
|  | −4 | 6 | |
|  | −5 | −6 | |
|  | −6 | 5 | |
|  | −7 | −5 | |
| −12 | −8 | 4 | Coding |
|  | −9 | 3 | Y = X − P |
|  | −10 | 2 | Decoding |
|  | −11 | 1 | X = Y + P |
|  | −12 | 0 | |

TABLE 6-continued

<When P = −12>
X: Value to be processed
P: Adjacent value
Y: Transmission value

| P | X | Y |
|---|---|---|
|   | −13 | −1 |
|   | −14 | −2 |
|   | −15 | −3 |
|   | −16 | −4 |

TABLE 7

(Prior Art)

| Difference value | Transmission value | Code length | Variable-length code |
|---|---|---|---|
| −16 & 16 | −16 | 11 | 0000 0011 001 |
| −15 & 17 | −15 | 11 | 0000 0011 011 |
| −14 & 18 | −14 | 11 | 0000 0011 101 |
| −13 & 19 | −13 | 11 | 0000 0011 111 |
| −12 & 20 | −12 | 11 | 0000 0100 001 |
| −11 & 21 | −11 | 11 | 0000 0100 011 |
| −10 & 22 | −10 | 10 | 0000 0100 11 |
| −9 & 23 | −9 | 10 | 0000 0101 01 |
| −8 & 24 | −8 | 10 | 0000 0101 11 |
| −7 & 25 | −7 | 8 | 0000 0111 |
| −6 & 26 | −6 | 8 | 0000 1001 |
| −5 & 27 | −5 | 8 | 0000 1011 |
| −4 & 28 | −4 | 7 | 0000 111 |
| −3 & 29 | −3 | 5 | 0001 1 |
| −2 & 30 | −2 | 4 | 0011 |
| −1 & 31 | −1 | 3 | 011 |
| 0 | 0 | 1 | 1 |
| 1 & −31 | 1 | 3 | 010 |
| 2 & −30 | 2 | 4 | 0010 |
| 3 & −29 | 3 | 5 | 0001 0 |
| 4 & −28 | 4 | 7 | 0000 110 |
| 5 & −27 | 5 | 8 | 0000 1010 |
| 6 & −26 | 6 | 8 | 0000 1000 |
| 7 & −25 | 7 | 8 | 0000 0110 |
| 8 & −24 | 8 | 10 | 0000 0101 10 |
| 9 & −23 | 9 | 10 | 0000 0101 00 |
| 10 & −22 | 10 | 10 | 0000 0100 10 |
| 11 & −21 | 11 | 11 | 0000 0100 010 |
| 12 & −20 | 12 | 11 | 0000 0100 000 |
| 13 & −19 | 13 | 11 | 0000 0011 110 |
| 14 & −18 | 14 | 11 | 0000 0011 100 |
| 15 & −17 | 15 | 11 | 0000 0011 010 |

TABLE 8

(Prior Art)
<When P = 5>
X: Value to be processed
P: Adjacent value        D = X − P
D: Difference value
Y: Transmission value    A = Y + P
A: Sum value

| P | X | D | Y | A | |
|---|---|---|---|---|---|
| 5 | 15 | 10 | 10 | 15 | Coding |
|   | 14 | 9 | 9 | 14 | Y = D |
|   | 13 | 8 | 8 | 13 | Decoding |
|   | 12 | 7 | 7 | 12 | X = A |
|   | 11 | 6 | 6 | 11 | |
|   | 10 | 5 | 5 | 10 | |
|   | 9 | 4 | 4 | 9 | |
|   | 8 | 3 | 3 | 8 | |
|   | 7 | 2 | 2 | 7 | |
|   | 6 | 1 | 1 | 6 | |
|   | 5 | 0 | 0 | 5 | |

TABLE 8-continued (Prior Art)
<When P = 5>
X: Value to be processed
P: Adjacent value        D = X − P
D: Difference value
Y: Transmission value    A = Y + P
A: Sum value

| P | X | D | Y | A | |
|---|---|---|---|---|---|
|   | 4 | −1 | −1 | 4 | |
|   | 3 | −2 | −2 | 3 | |
|   | 2 | −3 | −3 | 2 | |
|   | 1 | −4 | −4 | 1 | |
|   | 0 | −5 | −5 | 0 | |
|   | −1 | −6 | −6 | −1 | |
|   | −2 | −7 | −7 | −2 | |
|   | −3 | −8 | −8 | −3 | |
|   | −4 | −9 | −9 | −4 | |
|   | −5 | −10 | −10 | −5 | |
|   | −6 | −11 | −11 | −6 | |
|   | −7 | −12 | −12 | −7 | |
|   | −8 | −13 | −13 | −8 | |
|   | −9 | −14 | −14 | −9 | |
|   | −10 | −15 | −15 | −10 | |
|   | −11 | −16 | −16 | −11 | |
|   | −12 | −17 | 15 | 20 | Coding |
|   | −13 | −18 | 14 | 19 | Y = D + 32 |
|   | −14 | −19 | 13 | 18 | Decoding |
|   | −15 | −20 | 12 | 17 | X = A − 32 |
|   | −16 | −21 | 11 | 16 | |

TABLE 9

(Prior Art)
<When P = −12>
X: Value to be processed
P: Adjacent value        D = X − P
D: Difference value
Y: Transmission value    A = Y + P
A: Sum value

| P | X | D | Y | A | |
|---|---|---|---|---|---|
| −12 | 15 | 27 | −5 | −17 | Coding |
|   | 14 | 26 | −6 | −18 | Y = D − 32 |
|   | 13 | 25 | −7 | −19 | Decoding |
|   | 12 | 24 | −8 | −20 | X = A + 32 |
|   | 11 | 23 | −9 | −21 | |
|   | 10 | 22 | −10 | −22 | |
|   | 9 | 21 | −11 | −23 | |
|   | 8 | 20 | −12 | −24 | |
|   | 7 | 19 | −13 | −25 | |
|   | 6 | 18 | −14 | −26 | |
|   | 5 | 17 | −15 | −27 | |
|   | 4 | 16 | −16 | −28 | |
|   | 3 | 15 | 15 | 3 | Coding |
|   | 2 | 14 | 14 | 2 | Y = D |
|   | 1 | 13 | 13 | 1 | Decoding |
|   | 0 | 12 | 12 | 0 | X = A |
|   | −1 | 11 | 11 | −1 | |
|   | −2 | 10 | 10 | −2 | |
|   | −3 | 9 | 9 | −3 | |
|   | −4 | 8 | 8 | −4 | |
|   | −5 | 7 | 7 | −5 | |
|   | −6 | 6 | 6 | −6 | |
|   | −7 | 5 | 5 | −7 | |
|   | −8 | 4 | 4 | −8 | |
|   | −9 | 3 | 3 | −9 | |
|   | −10 | 2 | 2 | −10 | |
|   | −11 | 1 | 1 | −11 | |
|   | −12 | 0 | 0 | −12 | |
|   | −13 | −1 | −1 | −13 | |
|   | −14 | −2 | −2 | −14 | |
|   | −15 | −3 | −3 | −15 | |
|   | −16 | −4 | −4 | −16 | |

What is claimed is:

1. A differential coding method for coding values in a predetermined range, comprising the steps of:

giving different numbers individually to different values each obtained by calculating a difference value D between each value X to be coded and an adjacent value P adjacent thereto where the difference value D between the value X to be coded and the adjacent value P is calculated according to the equation $D=X-P$ where the value X to be coded exists in the range of $A<X<B$, wherein said different numbers are successively assigned to difference values D in ascending order of the absolute values of said difference values D;

assigning a code word to each difference value in the order that the code word increases in code length in accordance with the increase of the different numbers given to said difference values; and converting the difference value D into a transmission value Y with reference to a conversion reference value M according to the following equations:

in the case where $P \geq 0$:
Y = 2D when $D \geq 0$,
Y = −2D − 1 when $-M \leq D < 0$, and
Y = −D + M in any other case, and
in the case where $P < 0$:
Y = −2D − 1 when $D < 0$,
Y = 2D when $0 \leq D \leq M$, and
Y = D + M in any other case;

where M is a conversion reference value defined by the following equations:

$M=B-P$ when $P \geq 0$, and $M=P-A$ when $P<0$ where A and B are integers and $A<B$.

2. The differential coding method as claimed in claim 1, wherein the transmission values of serial integers are assigned to the difference values in accordance with the ascending order of the absolute values of the difference values, and each transmission value is converted into a variable-length code by giving a code to the transmission value in such a manner that the code words have their code length being longer as the transmission value increases in number within a predetermined number of code words.

3. The differential coding method as claimed in claim 3, wherein the integer A is −N and integer B is N−1, where N is an integer equal to or greater than 1.

4. The differential coding method as claimed in claim 1, wherein the step of converting the difference value into the transmission value includes the step of manipulating binary coded bits of data of the adjacent value, the conversion reference value, the difference value, and the value to be coded to perform product-sum operations thereof.

5. The differential coding method as claimed in claim 4, comprising the steps of:

calculating the conversion reference value M according to the equations for conversion as follows:

$M=(!P3, !P2, !P1, !P0)$ when P4=0, and $M=(P3, P2, P1, P0)$ when P4=1 where P4 is a code bit of P;

calculating the transmission value Y by converting the difference value D according to the equations:

in the case where $P4 = 0$,

Y = 2D = (D3, D2, D1, D0, 0) when $D \geq 0$;
Y = −2D − 1 = (!D3, !D2, !D1, !D0, 1) when $-M \leq D < 0$; and
Y = −D + M = (X4, !X3, !X2, !X1, !X0) in any other case; and in the other case where $P4 = 1$, Y = −2D − 1 = (!D3, !D2, !D1, !D0, 1) when $D < 0$;
Y = 2D = (D3, D2, D1, D0, 0) when $0 \leq D \leq M$; and
Y = D + M = $16 + X$ = (!X4, X3, X2, X1, X0) in any other case; and converting the transmission value Y into a variable-length code by giving a code having the shorter code length to the smaller transmission value in number, where the following values are represented by their bit data obtained through binary coding:

P: Adjacent value
where P is 5 bits of $(P4, P3, P2, P1, P0)$
X: Value to be coded
where X is 5 bits of $(X4, X3, X2, X1, X0)$
D: Difference value
where D is 6 bits of $(D5, D4, D3, D2, D1, D0)$
M: Conversion reference value
where M is 4 bits of $(M3, M2, M1, M0)$
Y: Transmission value
where Y is 5 bits of $(Y4, Y3, Y2, Y1, Y0)$.

6. The differential coding method as claimed in claim 1, wherein said value to be coded is a motion vector value.

7. A differential coding method for coding values in a predetermined range, comprising the steps of:

giving different numbers individually to different values each obtained by calculating a difference value D between each value X to be coded and an adjacent value P adjacent thereto where the difference value D between the value X to be coded and the adjacent value P is calculated according to the equation $D=X-P$, wherein said different numbers are successively assigned to said difference values in ascending order of the absolute values of said difference values;

assigning a code word to each difference value in the order that the code word increases in code length in accordance with the increase of the different numbers given to said difference values;

assigning the difference value a transmission value Y according to the following equations:

in the case where $P \leq 0$:

Y = $(N - 1 - X)/2$
when $(X \leq 2P - N)$ and (X is an odd number);
Y = $-(N - X)/2$
when $(X \leq 2P - N)$ and (X is an even number); and
Y = $X - P$ in any other case, and in the case where $P < 0$:

-continued $Y = (N+X)/2$ when $(X > 2P + N)$ and ($X$ is an even number), $Y = -(N+1+X)/2$ when $(X > 2P + N)$ and ($X$ is an odd number), and $Y = X - P$ in any other case where the transmission value Y is in the range of $-N \leq Y < N$ where N is a positive integer and characterized in that a code having the shorter code length is assigned to the transmission value having the smaller absolute value in ascending order of the absolute value of the transmission value Y so that each transmission value is converted into a variable-length code by giving a code to the transmission value in such a manner that the code words have their code length being longer as the transmission value increases in absolute value.

8. The differential coding method as claimed in claim 9, wherein the difference values are assigned directly to the transmission value Y when the difference values are within a first range having both positive and negative values of the difference values and the transmission value Y is assigned alternately to each negative and positive one of the difference values successively in ascending order of the absolute values of the difference values when the difference values in a second range are either negative or positive values.

9. The differential coding method as claimed in claim 7, wherein the step of converting the difference values into the transmission values includes the step of manipulating binary coded bits of data of the adjacent value, the difference value, and the value to be coded to perform product-sum operations thereof.

10. The differential coding method as claimed in claim 9, comprising the steps of:

obtaining the bit data of the following values through binary coding:

P: Adjacent value, where P is 5 bits of (P4, P3, P2, P1, P0),

X: Value to be coded, where X is 5 bits of (X4, X3, X2, X1, X0),

D: Difference value, where D is 6 bits of (D5, D4, D3, D2, D1, D0), and

Y: Transmission value, where Y is 5 bits of (Y4, Y3, Y2, Y1, Y0);

calculating a difference value D between the value X to be coded and the adjacent value P according to the following equation:

$D = X - P = (D5, D4, D3, D2, D1, D0)$;

calculating the transmission value Y by converting the difference value D with reference to values and P according to the following equations:

in the case where $P4 = 0$, $Y = (0, X4, !X3, !X2, !X1)$ when $X \leq (!P3,P2,P1,P0,0))$ and $X0 = 1$;

$Y = (1, !X4, X3, X2, X1)$ when $X \leq (2P - 16 = (!P3,P2,P1,P0,0))$ and $X0 = 0$; and $Y = D = (D5, D4, D3, D2, D1, D0)$ in any other case, and in the other case where $P4 = 1$, -continued $Y = (0, !X4, X3, X2, X1)$ when $X > (!P3,P2,P1,P0,0))$ and $X0 = 0$;

$Y = (1, X4, !X3, !X2, !X1)$ when $X > (!P3,P2,P1,P0,0))$ and $X0 = 1$; and $Y = D = (D5, D4, D3, D2, D1, D0)$ in any other case; and converting each transmission value Y into a variable-length code by giving a code having the shorter code length to the transmission value having the smaller absolute value.

11. The differential coding method as claimed in claim 7, wherein said value to be coded is a motion vector value.

12. A differential coding apparatus for coding a value of data comprising:

delay means for storing an adjacent value adjoining the value to be coded;

differentiation means for producing a difference value between the value to be coded and the adjacent value stored in said delay means;

conversion reference value generating means for generating as a conversion reference value the maximum in absolute value of a difference value range having a pair of positive and negative values among the entire range of the difference values between each value to be coded and the adjacent value stored in said delay means;

transmission value conversion means for assigning a transmission value to each difference value in ascending order of the absolute value of the difference value; and variable-length coding means for assigning a code to each transmission value in the order that the code increases in code length as the transmission value increases in number.

13. The differential coding apparatus as claimed in claim 12, wherein said value to be coded is a motion vector value.

14. The differential coding apparatus as claimed in claim 12, wherein said conversion reference value generating means and said transmission value conversion means are composed of bit manipulation means for manipulating binary coded bits of data of the adjacent value, the conversion reference value, the difference value, and the value to be coded.

15. The differential coding apparatus as claimed in claim 14, wherein said value to be coded is a motion vector value.

16. A differential coding apparatus for coding a value of data, the differential coding apparatus comprising:

delay means for storing an adjacent value adjoining each value to be coded where said value to be coded is a motion vector value;

transmission value conversion means for assigning a transmission value to a value of difference between the each value to be coded and the adjacent value stored in said delay means in ascending order of the absolute value of the difference value; and variable-length coding means for assigning a code to each transmission value in the order that the code increases in code length as the transmission value increases in number.

17. A differential coding apparatus for coding a value of data comprising:

delay means for storing an adjacent value adjoining each value to be coded;

transmission value conversion means for assigning a transmission value to a value of difference between the each value to be coded and the adjacent value stored in said delay means in ascending order of the absolute value of the difference value, said transmission value conversion means including bit manipulation means for manipulating binary code bits of data of the adjacent value, the difference value, and the value to be coded; and variable-length coding means for assigning a code to each transmission value in the order that the code increases in code length as the transmission value increases in number.

18. The differential coding apparatus as claimed in claim 17, wherein the value to be coded is a motion vector value.

* * * * *

UNITED STATES PATENT AND TRADEMARK OFFICE
CERTIFICATE OF CORRECTION

PATENT NO. : 5,608,398
DATED : March 4, 1997
INVENTOR(S) : Hashimoto et al.

It is certified that error appears in the above-identified patent and that said Letters Patent is hereby corrected as shown below:

Column 23, line 10, delete "$A<X<B$" and insert --$A \leq X \leq B$--.

Column 23, line 46, delete "3" and insert --1--.

Column 24, line 57, delete "$P \leq 0$" and insert --$P \geq 0$--.

Column 25, line 19, delete "9" and insert --7--.

Column 25, line 53, after "values" insert --X--.

Signed and Sealed this

Seventh Day of April, 1998

Attest:

BRUCE LEHMAN

*Attesting Officer*  *Commissioner of Patents and Trademarks*